US012811367B2

(12) United States Patent
Liang et al.

(10) Patent No.: US 12,811,367 B2
(45) Date of Patent: Nov. 24, 2026

(54) VCSEL WITH A SMALL DIVERGENCE ANGLE, VCSEL CHIP WITH A SMALL DIVERGENCE ANGLE, AND LIGHT SOURCE FOR A LIDAR SYSTEM

(71) Applicant: VERTILITE CO., LTD., Jiangsu (CN)

(72) Inventors: Dong Liang, Jiangsu (CN); Cheng Zhang, Jiangsu (CN)

(73) Assignee: VERTILITE CO., LTD., Jiangsu (CN)

( * ) Notice: Subject to any disclaimer, the term of this patent is extended or adjusted under 35 U.S.C. 154(b) by 763 days.

(21) Appl. No.: 18/021,018

(22) PCT Filed: Mar. 28, 2022

(86) PCT No.: PCT/CN2022/083262

§ 371 (c)(1),
(2) Date: Feb. 13, 2023

(87) PCT Pub. No.: WO2023/050739

PCT Pub. Date: Apr. 6, 2023

(65) Prior Publication Data

US 2024/0266804 A1 Aug. 8, 2024

Related U.S. Application Data

(60) Provisional application No. 63/249,976, filed on Sep. 29, 2021.

(30) Foreign Application Priority Data

Nov. 11, 2021 (CN) ......................... 202111333713.6

(51) Int. Cl.
*H01S 5/183* (2006.01)
*H01S 5/028* (2006.01)
(Continued)

(52) U.S. Cl.
CPC ...... *H01S 5/18358* (2013.01); *H01S 5/18311* (2013.01); *H01S 5/18333* (2013.01);
(Continued)

(58) Field of Classification Search
CPC ............. H01S 5/18358; H01S 5/18361; H01S 5/18311–18313; H01S 5/18383;
(Continued)

(56) References Cited

U.S. PATENT DOCUMENTS 5,747,827 A * 5/1998 Duggan ................. B82Y 20/00 257/14
6,611,546 B1 * 8/2003 Garnache ................ H01S 5/141 372/92
(Continued)

FOREIGN PATENT DOCUMENTS

CN 102255240 A 11/2011
CN 102324696 A 1/2012
(Continued)

OTHER PUBLICATIONS

International Search Report issued in corresponding International Application No. PCT/CN2022/083262 dated May 31, 2022, pp. 1-10.

(Continued)

*Primary Examiner* — Sean P Hagan
(74) *Attorney, Agent, or Firm* — Carter, DeLuca & Farrell LLP; George Likourezos

(57) ABSTRACT

A VCSEL with a small divergence angle includes an active layer and a lower Bragg reflection layer and an upper Bragg reflection layer on two opposite sides of the active layer. A light reservoir layer is disposed at at least one of a position between the lower Bragg reflection layer and the active layer or a position between the upper Bragg reflection layer and the active layer, where the light reservoir layer is configured
(Continued)

to store energy of a standing wave light field. An antireflection layer having an antireflection interface is disposed between the light reservoir layer and the active layer, where the antireflection layer is configured to increase a maximal light field intensity of the light reservoir layer to be higher than that of the active layer.

29 Claims, 11 Drawing Sheets

(51) Int. Cl.
*H01S 5/30* (2006.01)
*H01S 5/32* (2006.01)
*H01S 5/42* (2006.01)

(52) U.S. Cl.
CPC ........ *H01S 5/18388* (2013.01); *H01S 5/3095* (2013.01); *H01S 5/3213* (2013.01); *H01S 5/3215* (2013.01); *H01S 5/3216* (2013.01); *H01S 5/423* (2013.01); *H01S 5/028* (2013.01); *H01S 5/18369* (2013.01); *H01S 5/18383* (2013.01); *H01S 2301/18* (2013.01)

(58) Field of Classification Search
CPC .... H01S 5/3095; H01S 5/3211; H01S 5/3213; H01S 5/3125; H01S 5/3216; H01S 5/183-18397; H01S 5/028; H01S 5/0281; H01S 5/0282; H01S 5/0283; H01S 5/0287; H01S 5/18388
See application file for complete search history.

(56) References Cited

U.S. PATENT DOCUMENTS

| | | | | |
|---|---|---|---|---|
| 2002/0044582 | A1* | 4/2002 | Kondo | H01S 5/18388 372/96 |
| 2002/0094004 | A1* | 7/2002 | Furukawa | H01S 5/18397 372/46.01 |
| 2002/0121643 | A1 | 9/2002 | Mizuno et al. | |
| 2002/0150135 | A1* | 10/2002 | Naone | B82Y 20/00 372/45.011 |
| 2003/0053501 | A1* | 3/2003 | Sekiya | H01S 5/18361 372/50.11 |
| 2007/0280320 | A1* | 12/2007 | Feezell | H01S 5/18341 372/46.01 |
| 2009/0213889 | A1 | 8/2009 | Takeuchi | |
| 2012/0025714 | A1* | 2/2012 | Downing, Jr. | G02B 27/283 362/19 |
| 2015/0380904 | A1* | 12/2015 | Nagatomo | H01S 5/18366 372/45.01 |
| 2016/0248228 | A1* | 8/2016 | Kondo | G02B 26/10 |
| 2017/0040771 | A1* | 2/2017 | Suzuki | H03L 7/26 |
| 2017/0256915 | A1 | 9/2017 | Ghosh et al. | |
| 2018/0026419 | A1* | 1/2018 | Hirose | H01S 5/18394 353/22 |
| 2018/0183210 | A1 | 6/2018 | Padullaparthi | |
| 2019/0097394 | A1 | 3/2019 | Makino et al. | |
| 2020/0127441 | A1* | 4/2020 | Ghosh | H01S 5/02325 |
| 2020/0203928 | A1 | 6/2020 | Lee | |
| 2020/0403376 | A1 | 12/2020 | Weichmann et al. | |
| 2021/0050711 | A1 | 2/2021 | Shi et al. | |
| 2021/0057883 | A1 | 2/2021 | Seurin et al. | |
| 2021/0057888 | A1 | 2/2021 | Seurin et al. | |
| 2021/0281049 | A1 | 9/2021 | Seurin | |

FOREIGN PATENT DOCUMENTS

| | | | |
|---|---|---|---|
| CN | 102651536 | A | 8/2012 |
| CN | 107732656 | A | 2/2018 |
| CN | 109038219 | A | 12/2018 |
| CN | 110429473 | A | 11/2019 |
| CN | 111758193 | A | 10/2020 |
| CN | 111771312 | A | 10/2020 |
| CN | 112470352 | A | 3/2021 |
| JP | 2009238815 | A | 10/2009 |
| JP | 2016157910 | A | 9/2016 |
| KR | 19990050097 | A | 7/1999 |
| KR | 20020031002 | A | 4/2002 |
| TW | 202025583 | A | 7/2020 |

OTHER PUBLICATIONS

Japanese Office Action issued by the Japanese Patent Office in connection with International Application No. 2023-511679, dated Dec. 6, 2023.

Chinese Office Action issued by the Chinese Patent Office in connection with International Application No. 202111333713.6, dated Sep. 8, 2023.

European Search Report issued by the European Patent Office in connection with International Applicaiton No. 22871109.9, dated Dec. 3, 2024.

Korean Office Action issued by the Korean Patent Office in connection with International Applicaiton No. 10-2023-7005159, dated Dec. 10, 2024. (Translation).

Extended European Search Report issued in corresponding International Application No. 22871109.9, dated Apr. 15, 1 2025, pp. 1-18.

* cited by examiner

FIG. 1 -Prior art-

VCSEL WITH A SMALL DIVERGENCE ANGLE, VCSEL CHIP WITH A SMALL DIVERGENCE ANGLE, AND LIGHT SOURCE FOR A LIDAR SYSTEM

CROSS-REFERENCE AND CLAIM OF PRIORITY

This is a national stage application filed under 37 U.S.C. 371 based on International Patent Application No. PCT/CN2022/083262, filed Mar. 28, 2022, which claims priority to U.S. Provisional Application No. 63/249,976 entitled "Small divergence angle VCSEL with anti-reflection interface, anti-reflection layer or anti-reflection region" filed on Sep. 29, 2021, and Chinese Patent Application No. 202111333713.6 filed with the China National Intellectual Property Administration (CNIPA) on Nov. 11, 2021, the disclosures of which are incorporated herein by reference in their entireties.

TECHNICAL FIELD

Embodiments of the present application relate to the technical field of lasers, for example, a VCSEL with a small divergence angle, a VCSEL chip with a small divergence angle, and a light source for a LIDAR system.

BACKGROUND

A vertical-cavity surface-emitting laser (VCSEL) with a small divergence angle can produce light beams with a smaller divergence angle than a light-emitting diode (LED) or other incoherent light sources. The VCSEL with the small divergence angle is widely used in applications such as three-dimensional sensing, light detection and ranging, optical communication, and illumination and can provide small, compact, high-power laser sources for various applications.

The full divergence angle of a traditional VCSEL is typically about 20 degrees to 30 degrees. Although this divergence angle can meet the requirements of some traditional applications, it is still relatively large for new application scenarios and will limit the detection distance, resolution, and signal-to-noise ratio of three-dimensional sensors or laser radars. There is an urgent need in practical applications to further reduce the divergence angle of the light beams of the VCSEL.

SUMMARY

Embodiments of the present application provide a VCSEL with a small divergence angle, a VCSEL chip with a small divergence angle, and a light source for a LIDAR system.

Embodiments of the present application provide a VCSEL with a small divergence angle.

The VCSEL with the small divergence angle includes a lower Bragg reflection layer, an active layer, and an upper Bragg reflection layer.

The active layer is disposed on a side of the lower Bragg reflection layer.

The upper Bragg reflection layer is disposed on a side of the active layer facing away from the lower Bragg reflection layer.

A current confinement layer defining a light-emitting region is disposed in the active layer or outside the active layer. A light reservoir layer is disposed at at least one of a position between the lower Bragg reflection layer and the active layer or a position between the upper Bragg reflection layer and the active layer, where the light reservoir layer is configured to store light field energy. An antireflection layer having an antireflection interface is disposed between the light reservoir layer and the active layer, where the antireflection layer is configured to increase a maximal light field intensity of the light reservoir layer to be higher than a maximal light field intensity of the active layer.

In a second aspect, embodiments of the present application provide a VCSEL chip with a small divergence angle. The VCSEL chip with the small divergence angle includes multiple VCSELs with the small divergence angle according to a first respect, where the multiple VCSELs with the small divergence angle form an area array arrangement which is a regular arrangement, a random arrangement, or multiple subarrays for addressing.

In a third aspect, embodiments of the present application provide a light source for a LIDAR system which includes at least one VCSEL with the small divergence angle according to the first aspect or at least one VCSEL chip with the small divergence angle according to the second aspect.

DETAILED DESCRIPTION

Figure 1:
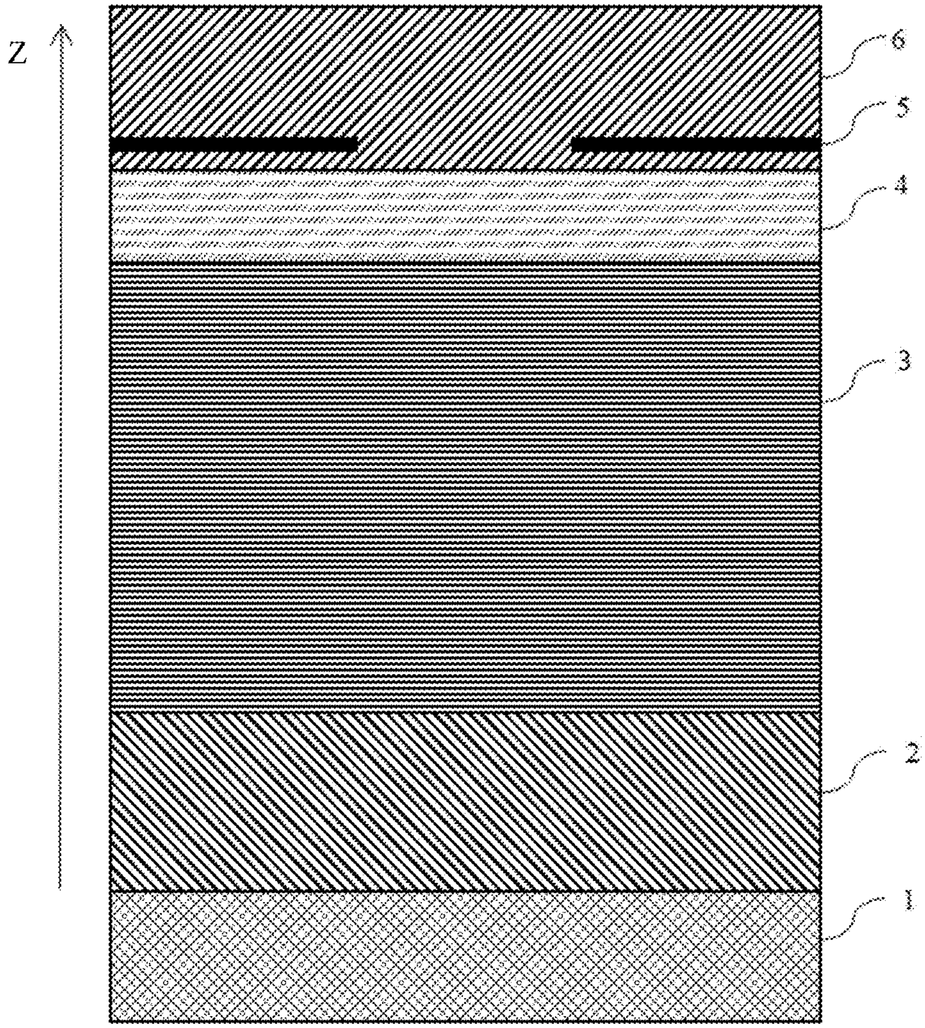
FIG. 1 is a structural diagram of a VCSEL in the related art.

The present application is further described in detail hereinafter in combination with the drawings and embodiments. It is to be understood that the embodiments described herein are intended to illustrate and not to limit the present application. In addition, it is to be noted that for ease of description, only part, not all, of structures related to the present application are illustrated in the drawings.

In the related art, to reduce a divergence angle of the light beams of the VCSEL, a typical method is to lengthen a cavity, so as to reduce a difference between an effective refractive index in a VCSEL light emission aperture and an effective refractive index outside the VCSEL light emission aperture, thereby suppressing the generation of a high-order mode. Light beams of the high-order mode have a larger divergence angle. Therefore, after the light beams of the high-order mode are suppressed, the remaining light beams of a low-order mode can have a smaller divergence angle. FIG. 1 is a structural diagram of a VCSEL in the related art. Referring to FIG. 1, a lower Bragg reflection layer 2, an active layer 4, and an upper Bragg reflection layer 6 are disposed on the same side of a substrate 1. The upper Bragg reflection layer 6 or the active layer 4 includes AlGaAs with a high aluminum content (where the Al content is generally more than 97% or even may be 100%, that is, pure AlAs). A current confinement layer may be formed through the oxidation of the AlGaAs. This layer will produce an aluminum oxide material in an environment with high-temperature water vapor. The current confinement layer is etched into a columnar terrace structure and oxidized from sides to form insulating aluminum oxide, and an unoxidized portion is still conductive AlGaAs. Such a structure may restrict a current to pass through only a conductive portion in the middle. The current confinement layer 5 formed in this manner is also generally referred to as an oxide layer. An aperture position is referred to as an oxide aperture, which is also the light emission aperture of the laser. The refractive index of the AlGaAs in the middle of the oxide aperture is different from the refractive index of the aluminum oxide on the outside, which results in the difference between the effective refractive index in the VCSEL light emission aperture and the effective refractive index outside the VCSEL light emission aperture.

The effective refractive index is determined based on the following formula:

$$n_{eff} = \frac{\int n(z)E^2(z)dz}{\int E^2(z)dz};$$

where $n_{eff}$ denotes the effective refractive index, n(z) denotes a refractive index in a z-axis direction, and $E^2(Z)$ denotes a light field intensity in the z-axis direction (that is, a light emission direction). The range of an integral is a range in which a light field exists in the laser.

The difference between the effective refractive index in the VCSEL light emission aperture and the effective refractive index outside the VCSEL light emission aperture is determined based on the following formula:

$$\Delta n_{eff} = n_{1\_eff} - n_{2\_eff}; \text{ and}$$
$$= \Gamma_{ox} \times (n_1 - n_2);$$

where $\Delta n_{eff}$ denotes the difference between the effective refractive index in the light emission aperture and the effective refractive index outside the light emission aperture, $n_{1\_eff}$ denotes the effective refractive index of the region where the light emission aperture is located, $n_{2\_eff}$ denotes the effective refractive index outside the light emission aperture, $n_1$ denotes the refractive index of a material (such as $Al_{0.98}Ga_{0.02}As$) with the high aluminum content, and $n_2$ denotes the refractive index of the aluminum oxide. $\Gamma_{ox}$ denotes a light confinement factor of the oxide layer, which is determined based on the following formula:

$$\Gamma_{ox} = \frac{\int_0^l n_2(z)E^2(z)dz}{\int_0^p n(z)E^2(z)dz};$$

where l denotes the thickness of the current confinement layer in the z-axis direction, p denotes the thickness of the entire light field in the z-axis direction, and $n_2(Z)$ denotes the refractive index of the aluminum oxide in the z-axis direction and may be considered as a fixed value, for example, $n_2(z)$ is equal to $n_2$.

To reduce the divergence angle of the light beams of the VCSEL, a middle Bragg reflection layer 3 is added to increase a cavity length, which can increase the value of p and reduce the value of $\Gamma_{ox}$. Thus, the difference between the effective refractive index in the light emission aperture and the effective refractive index outside the light emission aperture is reduced, thereby suppressing the generation of the high-order mode. The light beams of the high-order mode have the larger divergence angle. Therefore, after the light beams of the high-order mode are suppressed, the remaining light beams of the low-order mode can have the smaller divergence angle. However, the method of increasing the cavity length will raise new problems. After the cavity length is increased, a distance between longitudinal laser modes will also decrease, and an emission spectrum of the VCSEL will show multiple longitudinal modes, that is, multiple spectral peaks. In these multiple spectral peaks, in addition to a lasing wavelength we designed, there are other undesired spectral peaks which appear on one or both sides of the lasing wavelength we designed. These undesired spectral peaks are usually referred to as longitudinal modes.

Additionally, the appearance of the longitudinal modes will lead to some potential problems.

For example, a temperature drift coefficient of a light source is increased and temperature stability is decreased. For example, receiving ends of a three-dimensional sensor and a LIDAR system cannot recognize these longitudinal modes, resulting in decreased efficiency, crosstalk, and the like.

Figure 2:
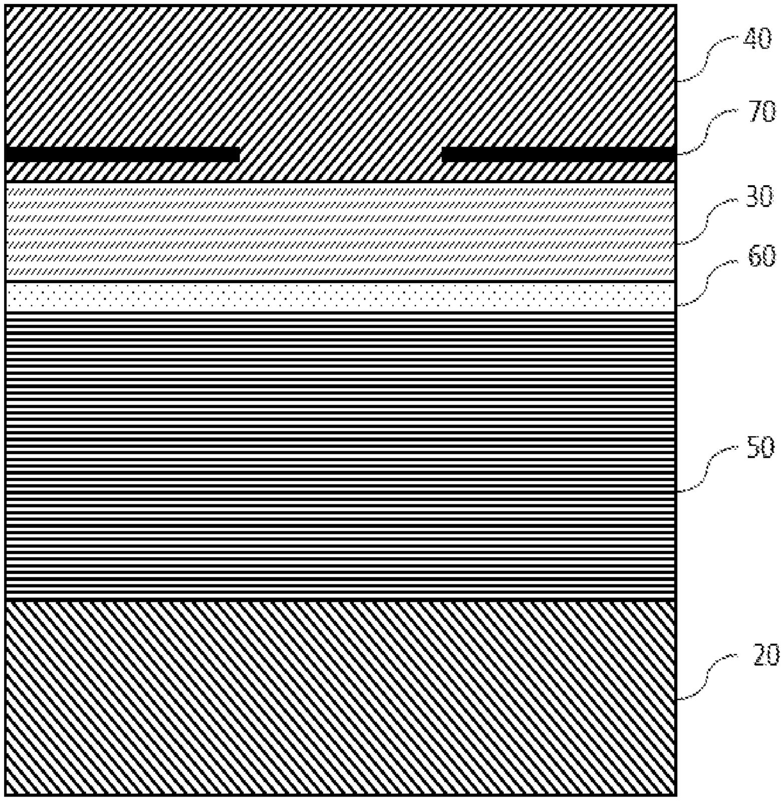
FIG. 2 is a structural diagram of a VCSEL with a small divergence angle according to an embodiment of the present application.
Figure 3:
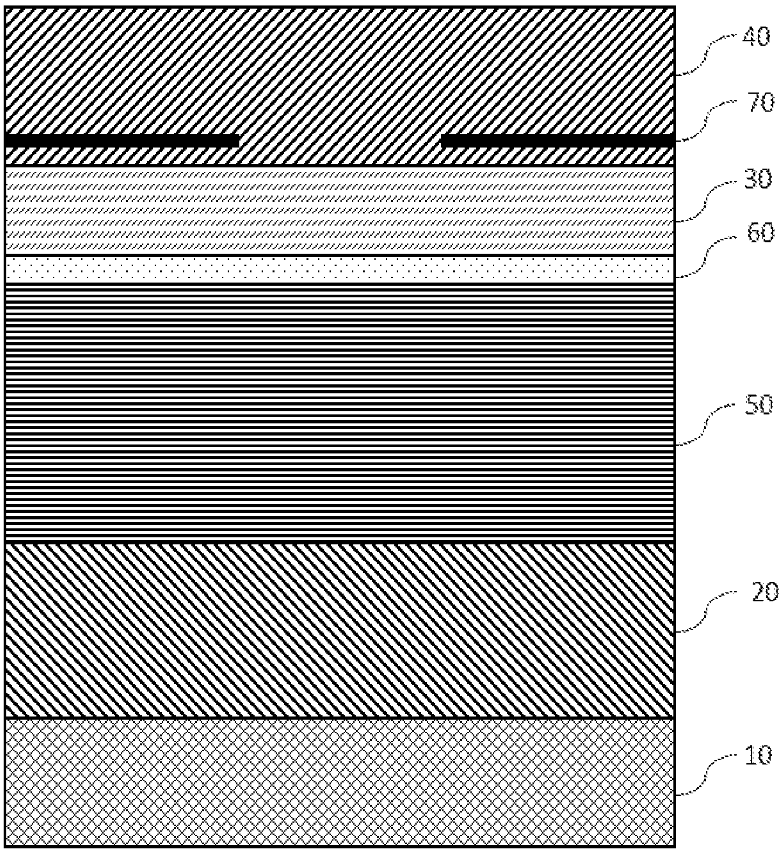
FIG. 3 is a structural diagram of another VCSEL with a small divergence angle according to an embodiment of the present application.
Figure 4:
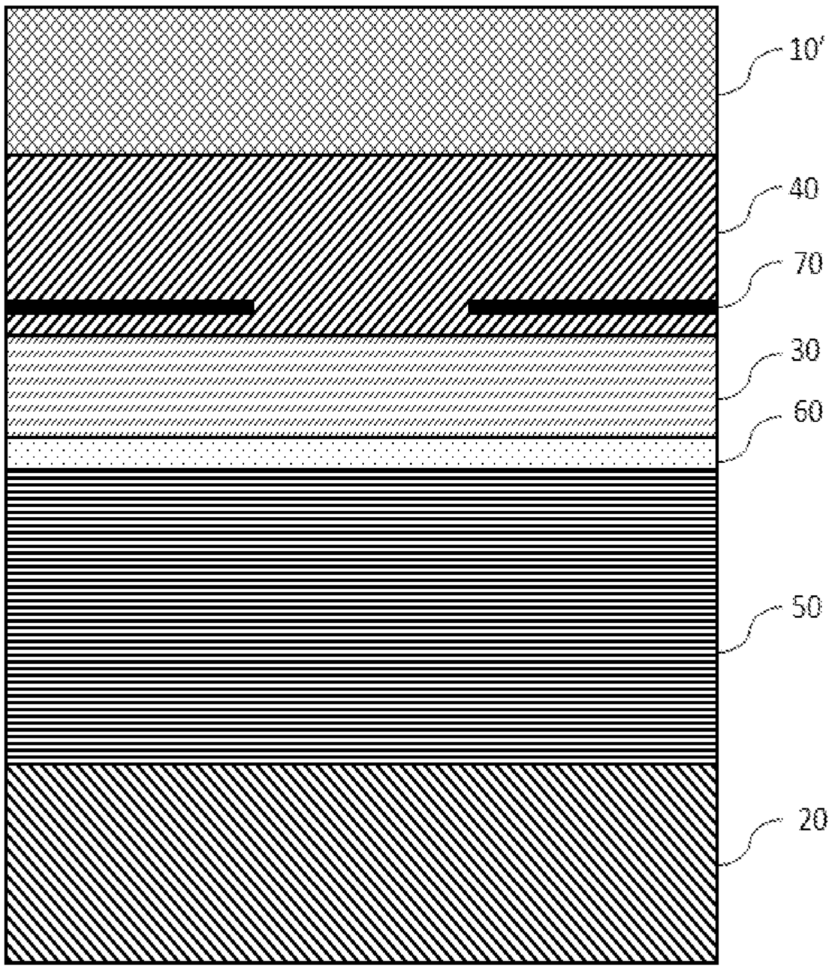
FIG. 4 is a structural diagram of another VCSEL with a small divergence angle according to an embodiment of the present application.
Figure 5:
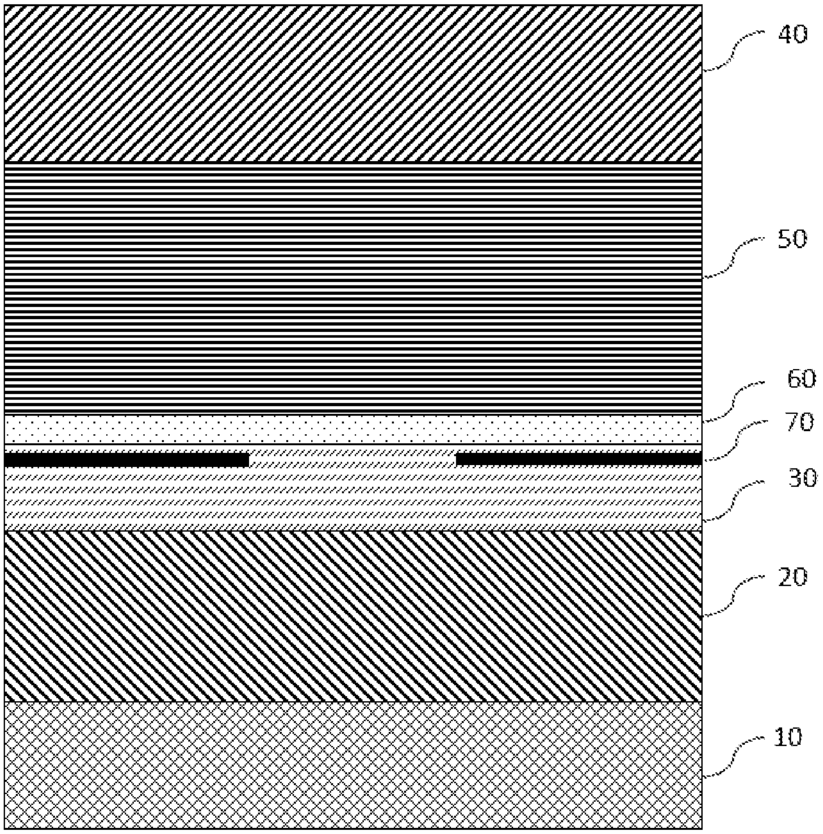
FIG. 5 is a structural diagram of another VCSEL with a small divergence angle according to an embodiment of the present application.
Figure 6:
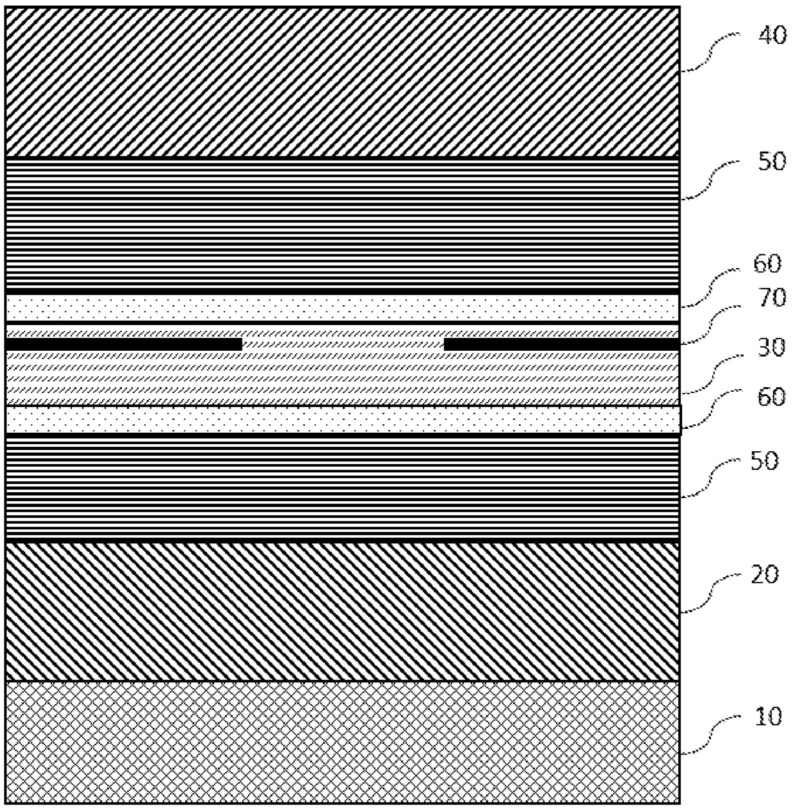
FIG. 6 is a structural diagram of another VCSEL with a small divergence angle according to an embodiment of the present application.

In view of this, the embodiments of the present application provide a VCSEL having a small divergence angle. FIG. 2 is a structural diagram of a VCSEL with a small divergence angle according to an embodiment of the present application; FIG. 3 is a structural diagram of another VCSEL with a small divergence angle according to an embodiment of the present application; FIG. 4 is a structural diagram of another VCSEL with a small divergence angle according to an embodiment of the present application; FIG. 5 is a structural diagram of another VCSEL with a small divergence angle according to an embodiment of the present application; and FIG. 6 is a structural diagram of another VCSEL with a small divergence angle according to an embodiment of the present application. Referring to FIGS. 2 to 6, the VCSEL with the small divergence angle includes a lower Bragg reflection layer 20, an active layer 30, and an upper Bragg reflection layer 40.

The active layer 30 is disposed on a side of the lower Bragg reflection layer 20.

The upper Bragg reflection layer 40 is disposed on a side of the active layer 30 facing away from the lower Bragg reflection layer 20.

A current confinement layer 70 defining a light-emitting region is disposed in the active layer 30 or near an outside of the active layer 30. A light reservoir layer 50 parallel to the active layer 30 is disposed at at least one of a position between the lower Bragg reflection layer 20 and the active layer 30 or a position between the upper Bragg reflection layer 40 and the active layer 30, where the light reservoir layer 50 is configured to store light field energy. An antireflection layer 60 having an antireflection interface is disposed between the light reservoir layer 50 and the active layer 30, where the antireflection layer 60 is configured to increase a maximal light field intensity of the light reservoir layer 50 to be higher than a maximal light field intensity of the active layer 30. Thus, the light reservoir layer 50 serves to store the light field energy more efficiently, thereby achieving a smaller light confinement factor with a shorter cavity.

For example, the lower Bragg reflection layer 20 includes multiple reflectors with an optical thickness of a quarter lasing wavelength, and the multiple reflectors are alternately disposed according to high and low refractive indexes; and the upper Bragg reflection layer 40 includes multiple reflectors with the optical thickness of the quarter lasing wavelength, and the multiple reflectors are alternately disposed according to the high and low refractive indexes. A material of the upper Bragg reflection layer 40 and the lower Bragg reflection layer 20 may be a dielectric material with an electrically insulating property. For example, the material may include silicon nitride, silicon oxide, aluminum oxide, titanium oxide, or the like. The material of the upper Bragg reflection layer 40 and the lower Bragg reflection layer 20 may be a semiconductor material, such as GaAs and the AlGaAs. Referring to FIGS. 3, 5, and 6, the VCSEL with the small divergence angle may further include a substrate 10, where the substrate 10 is disposed on a side of the lower Bragg reflection layer 20 facing away from the active layer 30, and the substrate 10 may be made of any material suitable for forming the laser and the material of the substrate 10 may be the GaAs, Si, or the like. Referring to FIG. 4, the VCSEL with the small divergence angle may be further provided with a transparent superstrate 10'. When the transparent superstrate 10' is formed, the substrate 10 is removed. The transparent superstrate 10' is disposed on a side of the upper Bragg reflection layer 40 facing away from the active layer 30, and a material of the transparent superstrate 10' may include a sapphire, quartz, glass, or a transparent polymer.

The current confinement layer 70 is included at an edge of a layer on the side facing the active layer 30, or the current confinement layer 70 is disposed in the active layer 30. The manner of wet oxidation of high aluminum content at a certain temperature condition may be adopted to oxidize a sidewall of a semiconductor layer (for example, a material of the semiconductor layer is aluminum gallium arsenide) where the current confinement layer 70 is disposed so that an oxide layer is formed, thereby forming the current confinement layer 70. The current confinement layer 70 has an aperture which is an unoxidized semiconductor layer and configured to define the light-emitting region of the laser. The aluminum oxide formed after being oxidized has a relatively high impedance, and an aperture position of the current confinement layer 70 is still the aluminum gallium arsenic with the high aluminum content. After the entry of a current, the current will flow to the active layer 30 through the aperture in the current confinement layer 70. The active layer 30 includes at least one quantum well, which may include a stacked composite quantum well structure. The composite quantum well structure is formed by stacking the GaAs and the AlGaAs, InGaAs and GaAsP, or the InGaAs and the AlGaAs and configured to convert electrical energy into light energy, thereby generating lasers. For example, a quantum well group has two to five quantum wells. A potential barrier exists between the quantum wells, and the potential barrier also exists outside the quantum well group. The optical path distance between a center of each quantum well along a direction perpendicular to the active layer 30 and a nearest antinode of a standing wave light field is less than one fifth of a lasing wavelength. When there is more than one quantum well, the optical path distance between the center position of one entire quantum well group and the nearest antinode of the standing wave light field is less than one tenth of the lasing wavelength. For example, the center position of the quantum well is aligned with a peak value of an electric field. Because the quantum well is the place where a laser gain is amplified, the center position of the quantum well is aligned with the strongest position of the light field, which can achieve a greater amplification effect. The light reservoir layer 50 parallel to the active layer 30 is disposed at at least one of the position between the lower Bragg reflection layer 20 and the active layer 30 or the position between the upper Bragg reflection layer 40 and the active layer 30. FIGS. 2 to 4 exemplarily show that the light reservoir layer 50 parallel to the active layer 30 is disposed between the lower Bragg reflection layer 20 and the active layer 30. FIG. 5 exemplarily shows that the light reservoir layer 50 parallel to the active layer 30 is disposed between the upper Bragg reflection layer 40 and the active layer 30. FIG. 6 exemplarily shows that light reservoir layers 50 parallel to the active layer 30 are respectively disposed between the lower Bragg reflection layer 20 and the active layer 30 and between the upper Bragg reflection layer 40 and the active layer 30. The antireflection layer 60 having the antireflection interface is disposed between the light reservoir layer 50 and the active layer 30, where the antireflection layer 60 is configured to increase the maximal light field intensity of the light reservoir layer 50 to be higher than the maximal light field intensity of the active layer 30. A material of the antireflection layer 60 and the light reservoir layer 50 may be the dielectric material, and the material of the antireflection layer 60 and the light reservoir layer 50 may be the semiconductor material.

It can be seen from the preceding formula that the difference between the effective refractive index in the VCSEL light emission aperture and the effective refractive index outside the VCSEL light emission aperture may be reduced through the reduction of the value of the coefficient $\Gamma_{ox}$, and the value of the coefficient $\Gamma_{ox}$ may be reduced in at least one manner of reducing its numerator and increasing its denominator. Since the current confinement layer 70 has a relatively little thickness and the increase of the cavity length p in the denominator will cause the longitudinal modes, an electric field intensity $E^2$ in the denominator is increased in the embodiment of the present application, that is, a light field intensity in the light reservoir layer 50 is increased so that the difference between the effective refractive index in the VCSEL light emission aperture and the effective refractive index outside the VCSEL light emission aperture is reduced, thereby suppressing the generation of the high-order mode and reducing the divergence angle. In addition, the light field intensity in the light reservoir layer 50 is increased so that the amplitude of increasing the cavity length can be reduced compared with the related art. Therefore, the problem may also be alleviated that the emission spectrum of the VCSEL shows the multiple longitudinal modes so that the divergence angle can be greatly reduced while single longitudinal mode lasing can be maintained. The problems are avoided that the temperature drift coefficient of the light source is increased and the temperature stability is decreased, and the receiving ends of the three-dimensional sensor and the LIDAR system cannot recognize these multiple wavelengths, resulting in the decreased efficiency, the crosstalk, and the like.

In summary, the VCSEL with the small divergence angle provided by the embodiments of the present application has the antireflection layer having the antireflection interface disposed between the light reservoir layer and the active layer, where the antireflection layer is configured to increase the maximal light field intensity of the light reservoir layer to be higher than the maximal light field intensity of the active layer. Thus, the light field intensity in the light reservoir layer is increased so that the difference between the effective refractive index in the VCSEL light emission aperture and the effective refractive index outside the VCSEL light emission aperture is reduced, thereby suppressing the generation of the high-order mode and reducing the divergence angle. In addition, the light field intensity in the light reservoir layer is increased so that an effective cavity length of the laser can also be effectively reduced, thereby increasing a wavelength difference between adjacent longitudinal modes, implementing the single longitudinal mode lasing, and avoiding a multi-wavelength output.

For example, the light reservoir layer is used for increasing the cavity length.

For example, the small divergence angle may denote a divergence angle of fewer than 20 degrees.

In an embodiment, the lower Bragg reflection layer 20 may be an n-type semiconductor layer, and the upper Bragg reflection layer 40 may be a p-type semiconductor layer. Alternatively, the lower Bragg reflection layer 20 may be a p-type semiconductor layer, and the upper Bragg reflection layer 40 may be an n-type semiconductor layer. If the upper Bragg reflection layer 40 is in direct contact with the active layer 30, the current confinement layer 70 may be disposed in the upper Bragg reflection layer 40. If the active layer 30 and the upper Bragg reflection layer 40 are spaced by the light reservoir layer 50, the current confinement layer 70 is disposed in the light reservoir layer 50. Alternatively, if the lower Bragg reflection layer 20 is in direct contact with the active layer 30, the current confinement layer 70 is disposed in the lower Bragg reflection layer 20. If the active layer 30 and the lower Bragg reflection layer 20 are spaced by the light reservoir layer 50, the current confinement layer 70 is disposed in the light reservoir layer 50. FIGS. 2 to 4 each exemplarily show a position where the current confinement layer 70 is disposed outside the active layer 30. To better define the light-emitting region, along the direction perpendicular to the active layer 30, the current confinement layer 70 is disposed within a two-wavelength range from the side of the active layer 30. Referring to FIG. 3, a light confinement factor of the current confinement layer 70 may be further reduced when the current confinement layer 70 is disposed outside the active layer 30, and the active layer 30 has only one side provided with the storage layer 50, for example, the current confinement layer 70 and the light reservoir layer 50 are disposed on opposite sides of the active layer 30.

Figure 15:
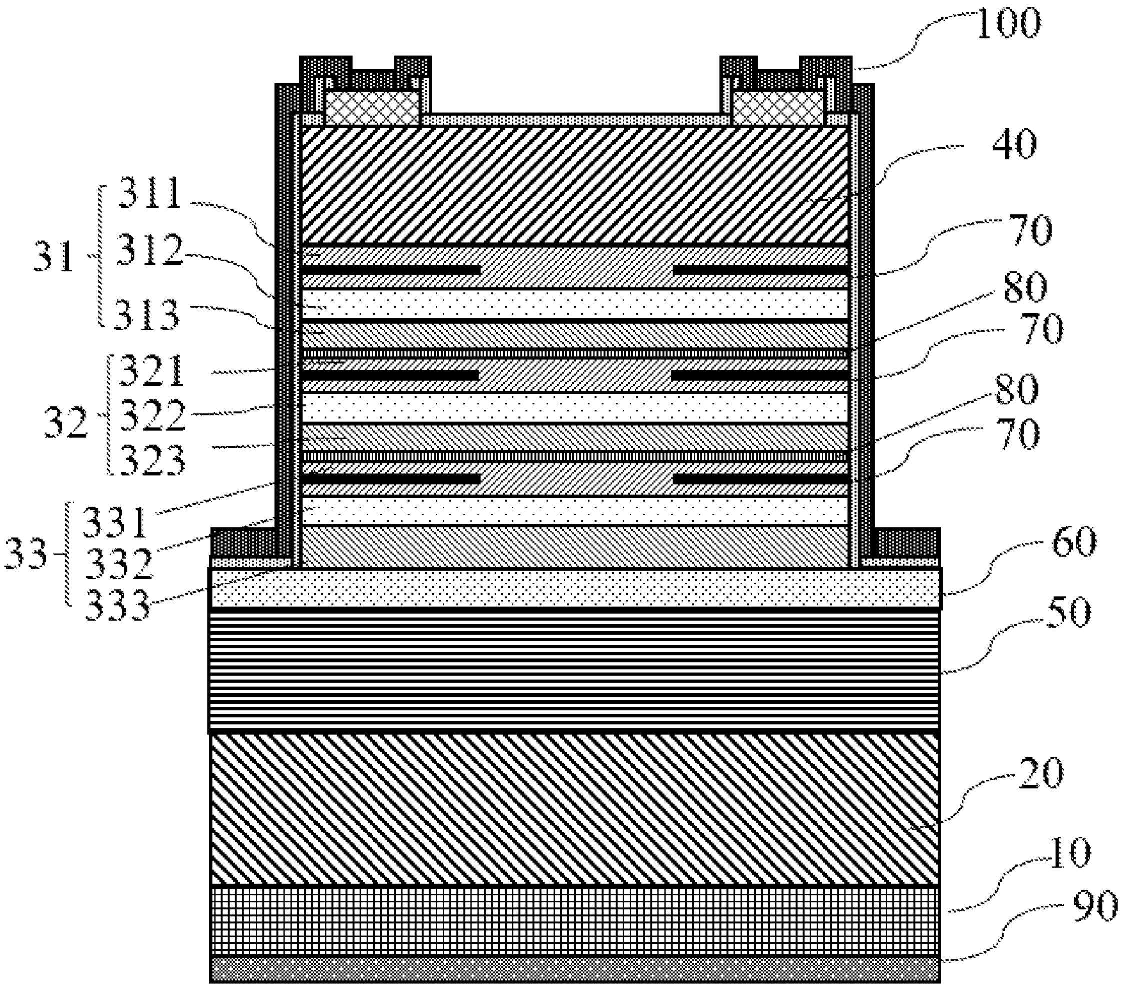
FIG. 15 is a structural diagram of another VCSEL with a small divergence angle according to an embodiment of the present application.

The current confinement layer 70 may also be disposed in the active layer 30. The optical path distance between the center of the current confinement layer 70 along the direction perpendicular to the active layer (for example, the z-axis direction) and a nearest node of the standing wave light field is less than one tenth of the lasing wavelength. Thus, the effect of defining the light-emitting region is ensured and additionally it may be further ensured that the position where the current confinement layer 70 is disposed has a relatively low light field intensity so that the light confinement factor of the current confinement layer 70 may be further reduced, thereby reducing a far-field divergence angle. It is to be noted that at least one current confinement layer 70 is provided. Different current confinement layers 70 may have apertures of the same size or different sizes. A light-emitting region defined by the current confinement layer 70 having the smallest aperture is used as the light-emitting region of the laser. FIGS. 5, 6, and 15 each exemplarily show a position where the current confinement layer 70 is disposed in the active layer 30. To better define the light-emitting region, the optical path distance between the center of the current confinement layer 70 along the direction perpendicular to the active layer 30 and the nearest node of the standing wave light field is less than one tenth of the lasing wavelength.

In an embodiment, along the direction in which the active layer 30 points to the light reservoir layer 50, the antireflection interface includes a first antireflection interface 61 which is between the light reservoir layer 50 and the active layer 30 and disposed at an interface position from a low refractive index to a high refractive index, and/or a second antireflection interface which is between the light reservoir layer 50 and the active layer 30 and disposed at an interface position from the high refractive index to the low refractive index.

The optical path distance between the first antireflection interface and the nearest antinode of the standing wave light field is less than one tenth of the lasing wavelength; and the optical path distance between the second antireflection interface and the nearest node of the standing wave light field is less than one tenth of the lasing wavelength.

Figure 7:
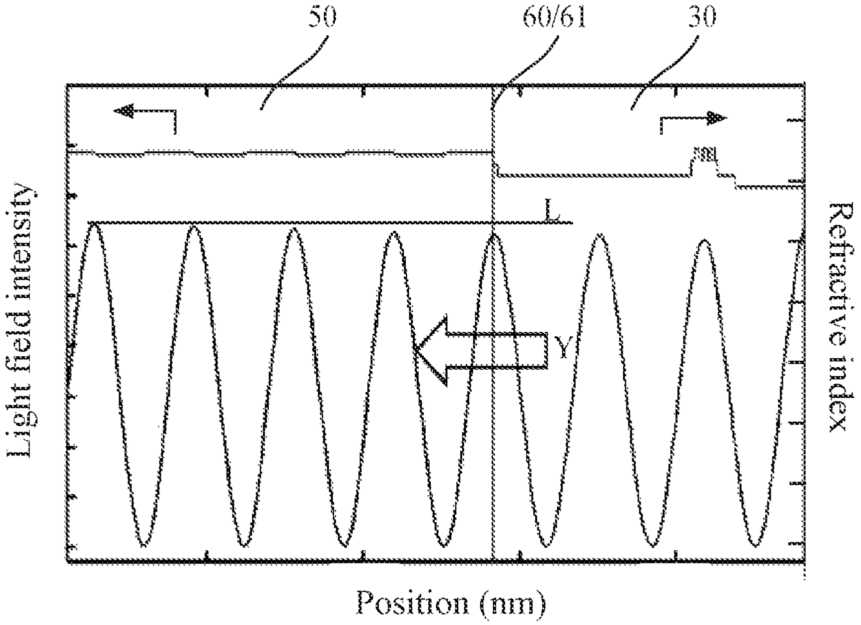
FIG. 7 shows a graph illustrating a light field intensity distribution and a graph illustrating a corresponding refractive index distribution under the action of a single layer of an antireflection interface according to an embodiment of the present application.
Figure 8:
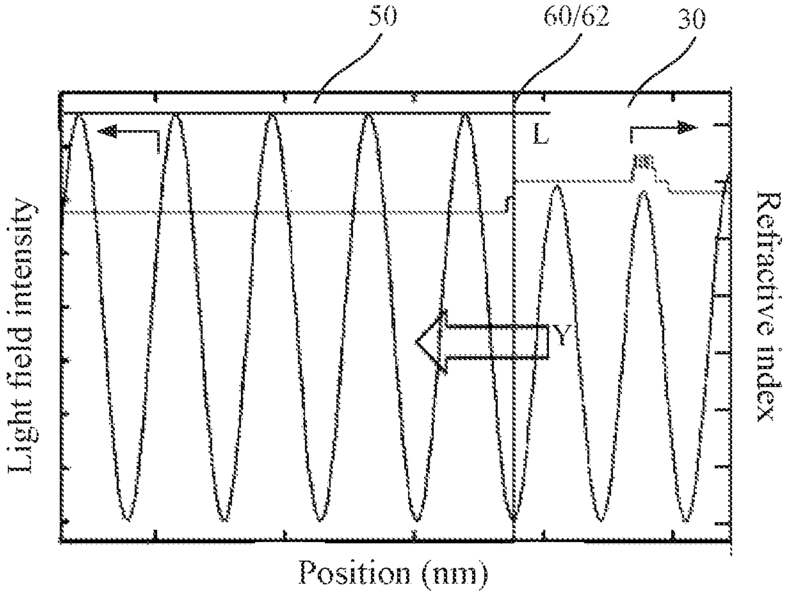
FIG. 8 shows another graph illustrating a light field intensity distribution and a graph illustrating a corresponding refractive index distribution under the action of a single layer of an antireflection interface according to an embodiment of the present application.
Figure 9:
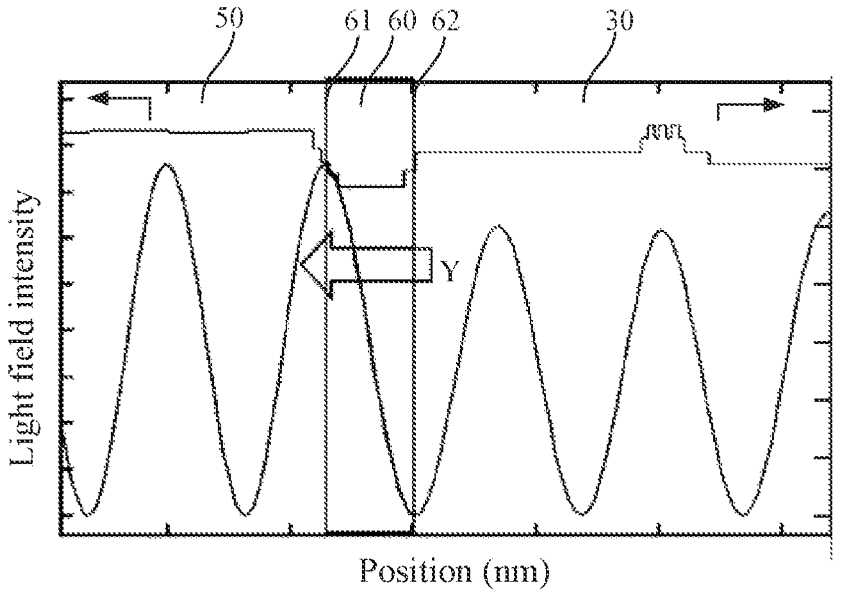
FIG. 9 shows a graph illustrating a light field intensity distribution and a graph illustrating a corresponding refractive index distribution under the action of double layers of antireflection interfaces according to an embodiment of the present application.
Figure 10:
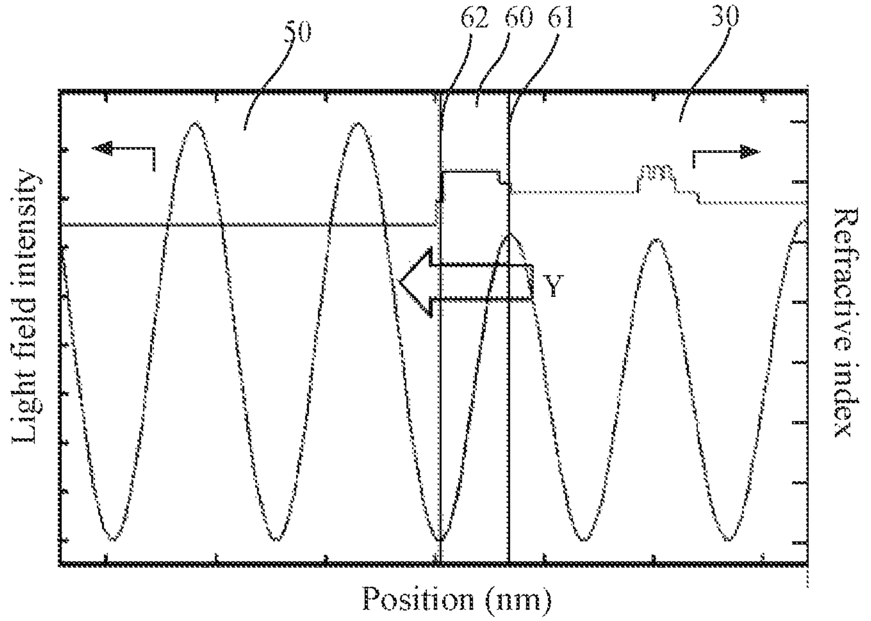
FIG. 10 shows another graph illustrating a light field intensity distribution and a graph illustrating a corresponding refractive index distribution under the action of double layers of antireflection interfaces according to an embodiment of the present application.
Figure 11:
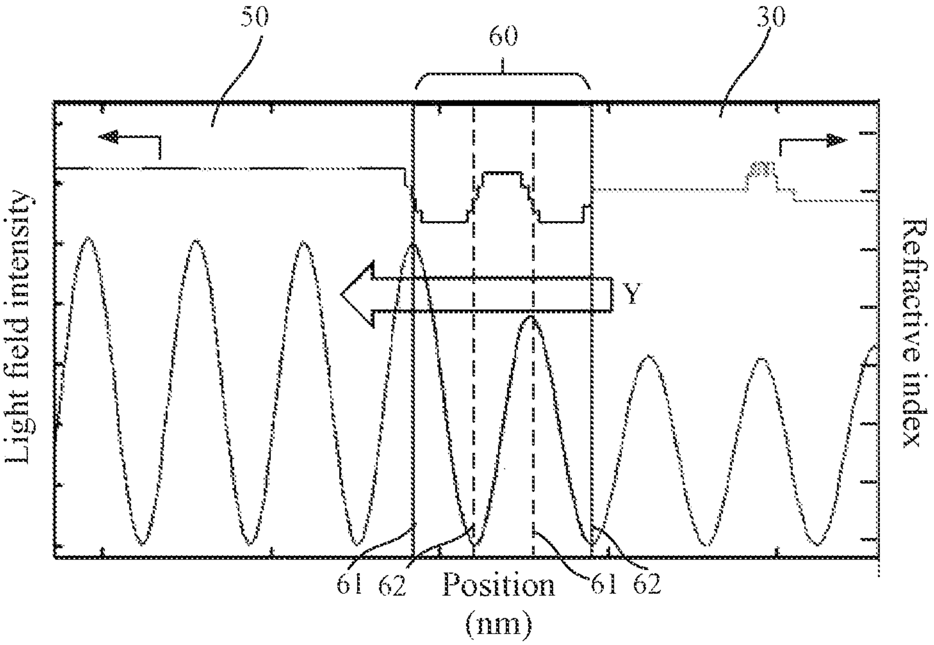
FIG. 11 shows a graph illustrating a light field intensity distribution and a graph illustrating a corresponding refractive index distribution under the action of multiple layers of antireflection interfaces according to an embodiment of the present application.

For example, the structure is used as an example that the light reservoir layer 50 parallel to the active layer 30 is disposed between the lower Bragg reflection layer 20 and the active layer 30. FIG. 7 shows a graph illustrating a light field intensity distribution and a graph illustrating a corresponding refractive index distribution under the action of a single layer of an antireflection interface according to an embodiment of the present application; FIG. 8 shows another graph illustrating a light field intensity distribution and a graph illustrating a corresponding refractive index distribution under the action of a single layer of an antireflection interface according to an embodiment of the present application; FIG. 9 shows a graph illustrating a light field intensity distribution and a graph illustrating a corresponding refractive index distribution under the action of double layers of antireflection interfaces according to an embodiment of the present application; FIG. 10 shows another graph illustrating a light field intensity distribution and a graph illustrating a corresponding refractive index distribution under the action of double layers of antireflection interfaces according to an embodiment of the present application; and FIG. 11 shows a graph illustrating a light field intensity distribution and a graph illustrating a corresponding refractive index distribution under the action of multiple layers of antireflection interfaces according to an embodiment of the present application. Referring to FIGS. 7 to 11, the direction Y in which the light field becomes stronger is the direction in which the active layer 30 points to the light reservoir layer 50. Along this direction, the optical path distance between the position of the interface (the first antireflection interface 61) which is in the antireflection layer 60 and enters a high-refractive-index layer from a low-refractive-index layer and the nearest antinode of the standing wave light field is less than one tenth of the lasing wavelength; and the optical path distance between the position of the interface (the second antireflection interface 62) which is in the antireflection layer 60 and enters the low-refractive-index layer from the high-refractive-index layer and the nearest node of the standing wave light field is less than one tenth of the lasing wavelength. The thicknesses of the high- and low-refractive-index layers and the positions of the interfaces are adjusted according to the preceding arrangement rule, which may ensure that the direction in which the light field of the antireflection layer 60 becomes stronger is the direction in which the active region 30 points to the light reservoir layer 50.

In an embodiment, the interface which is in the antireflection layer 60 and enters the high-refractive-index layer from the low-refractive-index layer is placed at an antinode of a standing wave light field, and the interface which is in the antireflection layer 60 and enters the low-refractive-index layer from the high-refractive-index layer is placed at a node of the standing wave light field, which can further increase the transmittance of the antireflection layer 60 and the light field intensity in the light reservoir layer 50. The difference between the effective refractive index in the VCSEL light emission aperture and the effective refractive index outside the VCSEL light emission aperture is further reduced, thereby suppressing the generation of the high-order mode and reducing the divergence angle of the lasers.

In an embodiment, the optical thickness of the active layer is an odd multiple of the quarter lasing wavelength.

For example, referring to FIG. 7, the distance between the antireflection interface and a gain quantum well is an integer multiple of a half wavelength, and the active layer 30 is also the integer multiple of the half wavelength. Referring to FIG. 8, the distance between the antireflection interface and the gain quantum well is the odd multiple of a quarter wavelength, and the active layer 30 is also the odd multiple of the quarter wavelength. Comparing positional relationships between straight lines L and wave peaks in FIGS. 7 and 8, it can be concluded that the antireflection effect of the antireflection interface when the optical thickness of the active layer 30 is the odd multiple of the quarter lasing wavelength is better than the antireflection effect of the antireflection interface when the optical thickness of the active layer 30 is the integer multiple of the half wavelength. In addition, the optical thickness of the active layer 30 is set to the odd multiple of the quarter wavelength, and a light field intensity in the active layer 30 is lower than a light field intensity in the active layer 30 in the related art. In this manner, an electric field intensity of the current confinement layer 70 disposed on the side facing the active layer 30 can be reduced so that the value of the coefficient $\Gamma_{ox}$ can be further reduced, thereby reducing the difference between the effective refractive index in the VCSEL light emission aperture and the effective refractive index outside the VCSEL light emission aperture and reducing the divergence angle of the lasers.

In FIG. 7, physical quantities represented by the wave and the upper horizontal line refer to a light field intensity and the refractive index, respectively.

In an embodiment, referring to FIGS. 7 and 8, the antireflection layer 60 includes one antireflection interface which is the first antireflection interface 61 or the second antireflection interface 62.

The antireflection interface is a contact interface between the storage layer 50 and the active layer 30, or the antireflection interface is an interface where a refractive index midpoint of a graded-refractive-index layer between the light reservoir layer 50 and the active layer 30 is located.

For example, the antireflection interface may be the contact interface between the light reservoir layer 50 and the active layer 30. For the antireflection layer 60 including only one antireflection interface, it may be understood as that the contact interface between the light reservoir layer 50 and the active layer 30 is used as the antireflection layer 60, where the thickness of the antireflection layer 60 is zero in this case. The antireflection interface may be the interface where the refractive index midpoint of the graded-refractive-index layer between the light reservoir layer 50 and the active layer 30 is located. Here, the graded-refractive-index layer may be understood as a film whose refractive index is graded, in the direction in which the active layer 30 points to the light reservoir layer 50, from the refractive index of the utmost edge of the active layer 30 toward the refractive index of the portion which is in the light reservoir layer 50 and the closest to the active layer 30. The graded-refractive-index layer is provided so that a resistance caused by a heterojunction can be reduced. For example, the graded-refractive-index layer may be set as a graded layer having a thickness range of 10 nm to 20 nm and made of a material $Al_{0.1}Ga_{0.9}As$ to $Al_{0.8}Ga_{0.2}As$, and the corresponding refractive index is also distributed in a graded manner. It may be understood as that the interface where the refractive index midpoint of the graded-refractive-index layer is located is used as the antireflection layer 60, and in this case, the thickness of the antireflection layer 60 is zero. If the antireflection interface is the first antireflection interface 61, the refractive index of the active layer 30 on one side of the antireflection interface is lower than the refractive index of the light reservoir layer 50 on the other side of the antireflection interface. If the antireflection interface is the second antireflection interface 62, the refractive index of the active layer 30 on one side of the antireflection interface side is higher than the refractive index of the light reservoir layer 50 on the other side of the antireflection interface.

In an embodiment, referring to FIGS. 9 and 10, the antireflection layer 60 includes two antireflection interfaces which are the first antireflection interface 61 and the second antireflection interface 62, respectively.

One of the two antireflection interfaces is a contact interface between the light reservoir layer 50 and the antireflection layer 60, or one of the antireflection interfaces is an interface where a refractive index midpoint of a graded-refractive-index layer between the light reservoir layer 50 and the antireflection layer 60 is located; and the other antireflection interface is a contact interface between the active layer 30 and the antireflection layer 60, or the other antireflection interface is an interface where a refractive index midpoint of a graded-refractive-index layer between the active layer 30 and the antireflection layer 60 is located.

For example, one antireflection interface is the contact interface between the light reservoir layer 50 and the antireflection layer 60, and the other antireflection interface is the contact interface between the active layer 30 and the antireflection layer 60. In this case, it may be understood as that the region between the two antireflection interfaces is the region where the antireflection layer 60 is disposed, the two interfaces of the antireflection layer 60 are the antireflection interfaces, and the thickness of the antireflection layer 60 is greater than zero. Alternatively, one antireflection interface is the interface where the refractive index midpoint of the graded-refractive-index layer between the light reservoir layer 50 and the antireflection layer 60 is located; and the other antireflection interface is the interface where the refractive index midpoint of the graded-refractive-index layer between the active layer 30 and the antireflection layer 60 is located. The graded-refractive-index layer between the light reservoir layer 50 and the antireflection layer 60 is used for reducing a resistance caused by a heterojunction between the light reservoir layer 50 and the antireflection layer 60; and the graded-refractive-index layer between the active layer 30 and the antireflection layer 60 is used for reducing a resistance caused by a heterojunction between the active layer 30 and the antireflection layer 60. In this case, the region between the two antireflection interfaces includes, in addition to the region where the antireflection layer 60 is disposed, part of graded-refractive-index layers, and the two interfaces of the antireflection layer 60 are not the antireflection interfaces. For ease of understanding, the film between the two antireflection interfaces is used as the antireflection layer 60 in the embodiment of the present application and the following embodiments.

For example, the graded-refractive-index layer between the light reservoir layer 50 and the antireflection layer 60 may be a layer independent of the light reservoir layer 50 and the antireflection layer 60, or the graded-refractive-index layer between the light reservoir layer 50 and the antireflection layer 60 may be a layer belonging to the light reservoir layer 50 and the antireflection layer 60 (for example, half of the graded-refractive-index layer belongs to the light reservoir layer 50 and the other half of the graded-refractive-index layer belongs to the antireflection layer 60), which is not limited thereto.

For example, the graded-refractive-index layer between the active layer 30 and the antireflection layer 60 may be a layer independent of the active layer 30 and the antireflection layer 60, or the graded-refractive-index layer between the active layer 30 and the antireflection layer 60 may be a layer belonging to the active layer 30 and the antireflection layer 60 (for example, half of the graded-refractive-index layer belongs to the active layer 30 and the other half of the graded-refractive-index layer belongs to the antireflection layer 60), which is not limited thereto.

The two antireflection interfaces are the first antireflection interface 61 and the second antireflection interface 62, respectively. Along the direction in which the active layer 30 points to the light reservoir layer 50, the first antireflection interface 61 is the interface which is between the light reservoir layer 50 and the active layer 30 and from the low refractive index to the high refractive index, and the second antireflection interface 62 is the interface which is between the light reservoir layer 50 and the active layer 30 and from the high refractive index to the low refractive index. Therefore, the refractive index of the antireflection layer 60 differs from the refractive index of a portion of the light reservoir layer 50 in contact with the antireflection layer 60 and the refractive index of a portion of the active layer 30 in contact with the antireflection layer 60 (for example, the active region 30 is formed by multiple different layers, and the portion of the active layer 30 in contact with the antireflection layer 60 refers to a portion which is in the active layer 30 and in contact with the antireflection layer 60). The antireflection layer 60 is a single-layer film. The refractive index of the antireflection layer 60 may be higher than both the refractive index of the portion of the light reservoir layer 50 in contact with the antireflection layer 60 and the refractive index of the portion of the active region in contact with the antireflection layer 60, or the refractive index of the antireflection layer 60 may be lower than both the refractive index of the portion of the light reservoir layer 50 in contact with the antireflection layer 60 and the refractive index of the portion of the active region in contact with the antireflection layer 60. When the refractive index of the antireflection layer 60 is higher than both the refractive index of the portion of the light reservoir layer 50 in contact with the antireflection layer 60 and the refractive index of the portion of the active layer 30 in contact with the antireflection layer 60, an antireflection interface on the side facing the active layer 30 is the first antireflection layer 61, and an antireflection interface on the side facing the light reservoir layer 50 is the second antireflection interface 62. When the refractive index of the antireflection layer 60 is lower than both the refractive index of the portion of the light reservoir layer 50 in contact with the antireflection layer 60 and the refractive index of the portion of the active layer 30 in contact with the antireflection layer 60, the antireflection interface on the side facing the active layer 30 is the second antireflection layer 62, and the antireflection interface on the side facing the light reservoir layer 50 is the first antireflection interface 61. The antireflection layer 60 in the embodiment of the present application includes the two antireflection interfaces, which can further increase the transmittance of the antireflection layer 60 and the light field intensity in the light reservoir layer 50. The difference between the effective refractive index in the VCSEL light emission aperture and the effective refractive index outside the VCSEL light emission aperture is further reduced, thereby suppressing the generation of the high-order mode and reducing the divergence angle of the lasers.

In addition, along the direction perpendicular to the active layer 30, the optical thickness between the first antireflection interface 61 and the second antireflection interface 62 is set to the odd multiple of the quarter lasing wavelength. A standing wave refers to a distribution state formed, along a transmission line, by two types of waves having the same frequency and opposite transmission directions. One of the waves is a reflected wave of the other wave. An antinode is formed at the point where the two waves are added, and a node is formed at the point where the two waves are subtracted. On a waveform of the standing wave, the node and the antinode each always have the same position, but the instantaneous value of the waveform changes with time. If amplitudes of the two waves are equal to each other, an amplitude of the node is zero. Light in the laser in the embodiment of the present application is a standing wave whose node amplitude is zero. Since a field of the standing wave is fixed, the same film moves in any direction by the odd multiple of the quarter wavelength, which has the opposite effect and may enhance reflection or implement antireflection. Compared with the case of the reflection toward the active layer 30, the antireflection layer 60 with the optical thickness of the odd multiple of the quarter lasing wavelength is disposed, which is equivalent to a movement by the odd multiple of the quarter wavelength. Thus, the reflection toward the active layer 30 is changed to the antireflection, which is equivalent to the reflection toward the light reservoir layer 50. The antireflection layer 60 in the embodiment of the present application is equivalent to a reflector toward the light reservoir layer 50. For the active layer 30, the light field energy is extracted. The light field energy of the active layer 30 is pressed into the structure of the light reservoir layer 50 outside the active layer 30. In an embodiment, the optical thickness between the first antireflection interface 61 and the second antireflection interface 62 is set to the quarter lasing wavelength, which can ensure the antireflection effect and reduce the cost and thickness of the laser.

In an embodiment, when the antireflection layer 60 includes two antireflection interfaces which are both first antireflection interfaces 61 or second antireflection interfaces 62. Similarly, one of the two antireflection interfaces is the contact interface between the light reservoir layer 50 and the antireflection layer 60, or one of the antireflection interfaces is the interface where the refractive index midpoint of the graded-refractive-index layer between the light reservoir layer 50 and the antireflection layer 60 is located; and the other antireflection interface is the contact interface between the active layer 30 and the antireflection layer 60, or the other antireflection interface is the interface where the refractive index midpoint of the graded-refractive-index layer between the active layer 30 and the antireflection layer 60 is located. The antireflection layer 60 is the single-layer film, and the magnitude of the refractive index of the antireflection layer 60 may be between the magnitude of the refractive index of the portion of the light reservoir layer 50 in contact with the antireflection layer 60 and the magnitude of the refractive index of the portion of the active region in contact with the antireflection layer 60. It is to be noted that the two antireflection interfaces are both the first antireflection interfaces 61, and along the direction perpendicular to the active layer 30, the optical thickness between the two antireflection interfaces is an integer multiple of a half lasing wavelength. Alternatively, the two antireflection interfaces are both the second antireflection interfaces 62, and along the direction perpendicular to the active layer 30, the optical thickness between the two antireflection interfaces is an integer multiple of a half lasing wavelength. It may be understood as that the optical thickness of the antireflection layer 60 in this case is the integer multiple of the half lasing wavelength.

In an embodiment, referring to FIG. 11, the number of antireflection interfaces included in the antireflection layer 60 is greater than or equal to three; the antireflection layer 60 includes m first antireflection interfaces 61 and n second antireflection interfaces 62, where m is an integer greater than or equal to one, and n is an integer greater than or equal to one; and one of a first one of the antireflection interfaces and an (m+n)-th one of the antireflection interfaces is the first antireflection interface 61 and the other one is the second antireflection interface 62, and the optical thickness of the antireflection layer 60 is the odd multiple of the quarter lasing wavelength.

Along the direction in which the active layer 30 points to the light reservoir layer 50, the first one of the antireflection interfaces is the contact interface between the active layer 30 and the antireflection layer 60, or the first one of the antireflection interfaces is the interface where the refractive index midpoint of the graded-refractive-index layer between the active layer 30 and the antireflection layer 60 is located; a second one to an (m+n−1)-th one of the antireflection interfaces are a contact interface between two adjacent high- and low-refractive-index sublayers in the antireflection layer 60, or the second one to the (m+n−1)-th one of the antireflection interfaces are an interface where a refractive index midpoint of a graded-refractive-index layer between high- and low-refractive-index sublayers is located; and the (m+n)-th one of the antireflection interfaces is the contact interface between the light reservoir layer 50 and the antireflection layer 60, or the (m+n)-th one of the antireflection interfaces is the interface where the refractive index midpoint of the graded-refractive-index layer between the light reservoir layer 50 and the antireflection layer 60 is located.

For example, the antireflection layer 60 may include multiple sublayers of different refractive indexes, and one antireflection interface exists between two adjacent sublayers. The number of the first antireflection interfaces 61 is m, and the number of the second antireflection interfaces 62 is n, where m is the integer greater than or equal to one, n is the integer greater than or equal to one, and m may be equal or unequal to n. The first one of the antireflection interface and the (m+n)-th one of the antireflection interfaces are respectively the outermost antireflection interfaces on two sides of the antireflection layer 60. The first one of the antireflection interfaces may be the contact interface between the active layer 30 and the antireflection layer 60, or the first one of the antireflection interfaces may be the interface where the refractive index midpoint of the graded-refractive-index layer between the active layer 30 and the antireflection layer 60 is located; and the (m+n)-th one of the antireflection interfaces is the contact interface between the light reservoir layer 50 and the antireflection layer 60, or the (m+n)-th one of the antireflection interfaces is the interface where the refractive index midpoint of the graded-refractive-index layer between the light reservoir layer 50 and the antireflection layer 60 is located. One of the first one of the antireflection interfaces and the (m+n)-th one of the antireflection interfaces is the first antireflection interface 61 and the other one is the second antireflection interface 62. The optical thickness between the first one of the antireflection interfaces and the (m+n)-th one of the antireflection interfaces is the odd multiple of the quarter lasing wavelength, that is, the optical thickness of the antireflection layer 60 is the odd multiple of the quarter lasing wavelength. FIG. 11 exemplarily shows two first antireflection interfaces 61 and two second antireflection interfaces 62, where the first one of the antireflection interfaces is the second antireflection interface 62 and a fourth one of the antireflection interfaces is the first antireflection interface 61.

The second one to the (m+n−1)-th one of the antireflection interfaces are the contact interface between the two adjacent high- and low-refractive-index sublayers in the antireflection layer 60, or the second one to the (m+n−1)-th one of the antireflection interfaces are the interface where the refractive index midpoint of the graded-refractive-index layer between the high- and low-refractive-index sublayers is located. The distance between any two first antireflection interfaces 61 or the distance between any two second antireflection interfaces 62 is the integer multiple of the half lasing wavelength; and the distance between any first antireflection interface 61 and any second antireflection interface 62 is the odd multiple of the quarter lasing wavelength. The first antireflection interfaces 61 and the second antireflection interfaces 62 may be alternately or continuously disposed. It may be understood as that one of two adjacent antireflection interfaces may be the first antireflection interface 61 and the other may be the second antireflection interface 62. In this case, the thickness of a sublayer formed by the two adjacent antireflection interfaces is the odd multiple of the quarter lasing wavelength, and the refractive index of the sublayer is lower or higher than refractive indexes of sublayers on two sides of the sublayer. The two adjacent antireflection interfaces may be both the first antireflection interfaces 61 or the second antireflection interfaces 62. In this case, the thickness of the sublayer formed by the two adjacent antireflection interfaces is the integer multiple of the half lasing wavelength, and the magnitude of the refractive index of the sublayer is between the magnitudes of the refractive indexes of the sublayers on the two sides of the sublayer. The antireflection layer 60 in the embodiment of the present application includes at least three antireflection interfaces, which can further increase the transmittance of the antireflection layer 60 and the light field intensity in the light reservoir layer 50. The difference between the effective refractive index in the VCSEL light emission aperture and the effective refractive index outside the VCSEL light emission aperture is further reduced, thereby suppressing the generation of the high-order mode and reducing the divergence angle of the lasers.

Figure 12:
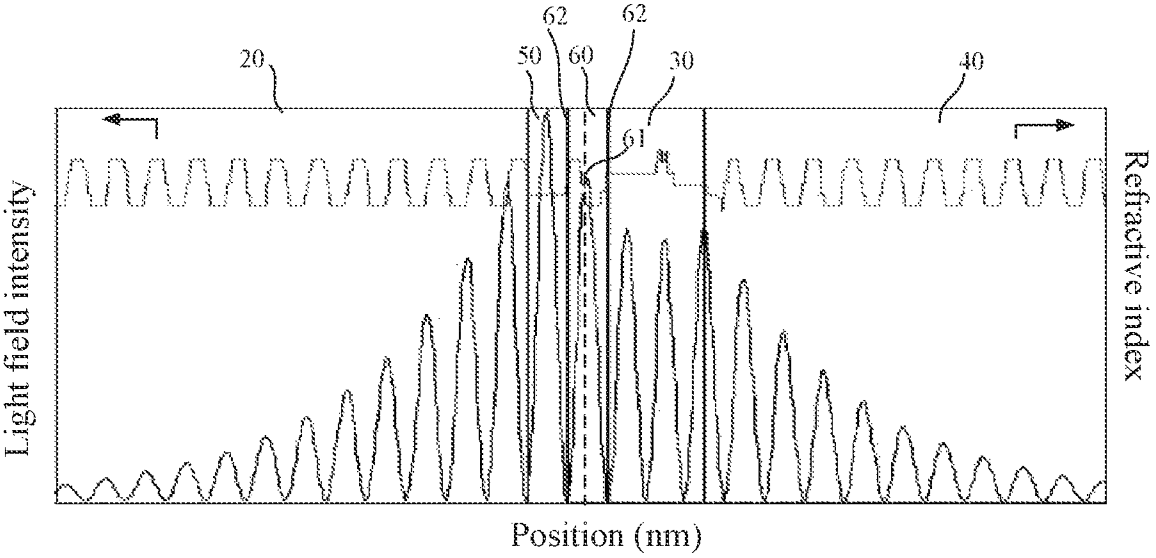
FIG. 12 shows another graph illustrating a light field intensity distribution and a graph illustrating a corresponding refractive index distribution under the action of multiple layers of antireflection interfaces according to an embodiment of the present application.
Figure 13:
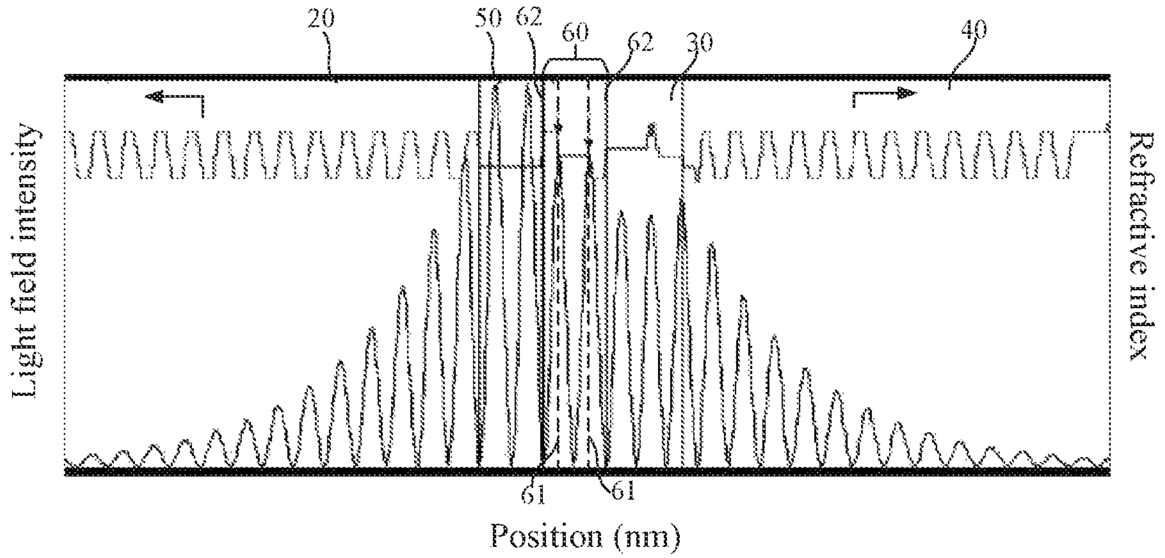
FIG. 13 shows another graph illustrating a light field intensity distribution and a graph illustrating a corresponding refractive index distribution under the action of multiple layers of antireflection interfaces according to an embodiment of the present application.

In an embodiment, FIG. 12 shows another graph illustrating a light field intensity distribution and a graph illustrating a corresponding refractive index distribution under the action of multiple layers of antireflection interfaces according to an embodiment of the present application; and FIG. 13 shows another graph illustrating a light field intensity distribution and a graph illustrating a corresponding refractive index distribution under the action of multiple layers of antireflection interfaces according to an embodiment of the present application. Referring to FIGS. 12 and 13, the number of antireflection interfaces included in the antireflection layer 60 is greater than or equal to three; and when the antireflection layer 60 includes the m first antireflection interfaces 61 and the n second antireflection interfaces 62, both the first one of the antireflection interfaces and the (m+n)-th one of the antireflection interfaces are set to be the first antireflection interfaces 61 or the second antireflection interfaces 62, and in this case, the optical thickness of the antireflection layer 60 is the integer multiple of the half lasing wavelength. For the manner of setting the second one to the (m+n−1)-th one of the antireflection interfaces, reference may be made to the preceding embodiment. The details are not repeated here. FIG. 13 exemplarily shows that two adjacent antireflection interfaces in the middle are both the first antireflection interfaces 61. It is to be noted that in this case, m is an integer greater than or equal to zero, and n is an integer greater than or equal to zero. That is, the antireflection interfaces included in the antireflection layer 60 may be both the first antireflection interfaces 61 or the second antireflection interfaces 62.

In an embodiment, with continued reference to FIG. 11, the antireflection layer 60 includes the m first antireflection interfaces 61 and the n second antireflection interfaces 62. The first antireflection interfaces 61 and the second antireflection interfaces 62 are alternately disposed, and the optical thickness between the two adjacent antireflection interfaces is the quarter lasing wavelength. FIG. 11 exemplarily shows that n' and m are both equal to two.

For example, the antireflection layer 60 may include the multiple sublayers of different refractive indexes, and the one antireflection interface exists between the two adjacent sublayers. The optical thickness between the two adjacent antireflection interfaces is the odd multiple of the quarter lasing wavelength. In an embodiment, the optical thickness of the two adjacent antireflection interfaces is set to the quarter lasing wavelength. It may be understood as that the antireflection layer 60 is a group of Bragg reflection layers in which high- and low-reflectance sublayers are alternately distributed, where the group of Bragg reflection layers have a thickness of the quarter wavelength. The phase of the group of Bragg reflection layers is shifted by the quarter wavelength, which is equivalent to reflecting light from the light reservoir layer 50, and the antireflection effect can be achieved for the active layer 30. The first antireflection interfaces 61 and the second antireflection interfaces 62 are alternately disposed, and the thickness between the two adjacent antireflection interfaces is set to the quarter lasing wavelength. For the antireflection layer 60 of the same thickness, the number of antireflection interfaces included in the antireflection layer 60 can be maximized, which can further increase the transmittance of the antireflection layer 60 and the light field intensity in the light reservoir layer 50. The difference between the effective refractive index in the VCSEL light emission aperture and the effective refractive index outside the VCSEL light emission aperture is further reduced, thereby suppressing the generation of the high-order mode and reducing the divergence angle of the lasers.

In an embodiment, along the direction in which the active layer 30 points to the light reservoir layer 50, the optical distance between the first antireflection interface 61 of the antireflection layer 60 and any interface which is from the low refractive index to the high refractive index and in a Bragg reflection layer on the opposite side to the light reservoir layer 50 with respect to the active layer 30 is the integer multiple of the half wavelength, where the Bragg reflection layer is the upper Bragg reflection layer 40 or the lower Bragg reflection layer 20; and the optical distance between the first antireflection interface 61 of the antireflection layer 60 and any interface which is from the low refractive index to the high refractive index and in a Bragg reflection layer on the same side of the light reservoir layer 50 with respect to the active layer 30 is the odd multiple of the quarter lasing wavelength, where the Bragg reflection layer is the upper Bragg reflection layer 40 or the lower Bragg reflection layer 20.

The optical distance between the second antireflection interface 62 of the antireflection layer 60 and any interface which is from the high refractive index to the low refractive index and in the Bragg reflection layer on the opposite side to the light reservoir layer 50 with respect to the active layer 30 is the integer multiple of the half wavelength, where the Bragg reflection layer is the upper Bragg reflection layer 40 or the lower Bragg reflection layer 20; and the optical distance between the second antireflection interface 62 of the antireflection layer 60 and any interface which is from the high refractive index to the low refractive index and in the Bragg reflection layer on the same side of the light reservoir layer 50 with respect to the active layer 30 is the odd multiple of the quarter lasing wavelength, where the Bragg reflection layer is the upper Bragg reflection layer 40 or the lower Bragg reflection layer 20.

For example, along the direction in which the active layer 30 points to the light reservoir layer 50, the optical distance between any interface which is from the low refractive index to the high refractive index and in the antireflection layer 60 and any interface which is from the low refractive index to the high refractive index and in the Bragg reflection layer on the opposite side to the light reservoir layer 50 with respect to the active layer 30 is the integer multiple of the half wavelength, where the Bragg reflection layer is the upper Bragg reflection layer 40 or the lower Bragg reflection layer 20; and the optical distance between any interface which is from the low refractive index to the high refractive index and in the antireflection layer 60 and any interface which is from the low refractive index to the high refractive index and in the Bragg reflection layer on the same side of the light reservoir layer 50 with respect to the active layer 30 is the odd multiple of the quarter lasing wavelength, where the Bragg reflection layer is the upper Bragg reflection layer 40 or the lower Bragg reflection layer 20. Along the direction in which the active layer 30 points to the light reservoir layer 50, the optical distance between any interface which is from the high refractive index to the low refractive index and in the antireflection layer 60 and any interface which is from the high refractive index to the low refractive index and in the Bragg reflection layer on the opposite side to the light reservoir layer 50 with respect to the active layer 30 is the integer multiple of the half wavelength, where the Bragg reflection layer is the upper Bragg reflection layer 40 or the lower Bragg reflection layer 20; and the optical distance between any interface which is from the high refractive index to the low refractive index and in the antireflection layer 60 and any interface which is from the high refractive index to the low refractive index and in the Bragg reflection layer on the same side of the light reservoir layer 50 with respect to the active layer 30 is the odd multiple of the quarter lasing wavelength, where the Bragg reflection layer is the upper Bragg reflection layer 40 or the lower Bragg reflection layer 20. In the relationship set like this, the optical thickness of the light reservoir layer 50 is set to the integer multiple of the half wavelength, and the optical thickness of the active layer 30 is set to the odd multiple of the quarter wavelength.

Figure 14:
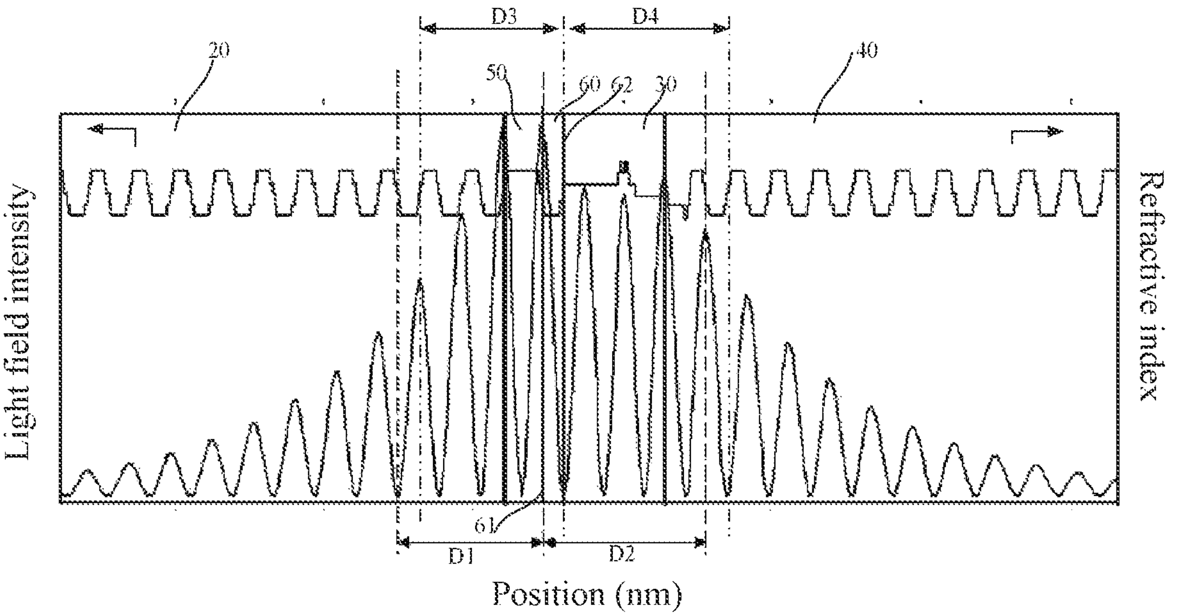
FIG. 14 shows a graph illustrating a light field intensity distribution and a graph illustrating a refractive index distribution according to an embodiment of the present application.

For example, FIG. 14 shows a graph illustrating a light field intensity distribution and a graph illustrating a refractive index distribution according to an embodiment of the present application. Referring to FIG. 14, the structure is used as an example that the light reservoir layer 50 is disposed between the lower Bragg reflection layer 20 and the active layer 30, and the antireflection layer 60 is the single-layer film with a refractive index lower than both the refractive index of the double-layer light reservoir layer 50 and the refractive index of the double-layer active layer 30. The optical distance D2 between the first antireflection interface 61 of the antireflection layer 60 and any interface which is from the low refractive index to the high refractive index and in the upper Bragg reflection layer 40 on the opposite side to the light reservoir layer 50 with respect to the active layer 30 is the integer multiple of the half wavelength, that is, an even multiple of the quarter lasing wavelength; and the optical distance D1 between the first antireflection interface 61 of the antireflection layer 60 and any interface which is from the low refractive index to the high refractive index and in the lower Bragg reflection layer on the same side of the light reservoir layer 50 with respect to the active layer 30 is the odd multiple of the quarter lasing wavelength. The optical distance D4 between the second antireflection interface 62 of the antireflection layer 60 and any interface which is from the high refractive index to the low refractive index and in the upper Bragg reflection layer 40 on the opposite side to the light reservoir layer 50 with respect to the active layer 30 is the integer multiple of the half wavelength, that is, the even multiple of the quarter lasing wavelength; and the optical distance D3 between the second antireflection interface 62 of the antireflection layer 60 and any interface which is from the high refractive index to the low refractive index and in the lower Bragg reflection layer 20 on the same side of the light reservoir layer 50 with respect to the active layer 30 is the odd multiple of the quarter lasing wavelength. It is to be noted that to embody the positional relationship between the interfaces, FIG. 14 exemplarily shows only that the optical thickness of the light reservoir layer 50 is the half wavelength, and the optical thickness of the active layer 30 is five times the quarter lasing wavelength.

In an embodiment, referring to FIG. 8, 10, or 11, the refractive index of the light reservoir layer 50 is uniformly distributed along the direction perpendicular to the active layer 30. Since the optical thickness of the optical storage layer 50 is set to the integer multiple of the half wavelength, the optical storage layer 50 may be equivalent to a half-wave resonant cavity so that the lower Bragg reflection layer 20 and the antireflection layer 60 on two sides of the light reservoir layer 50 may have opposite reflection directions, that is, the lower Bragg reflection layer 20 and the antireflection layer 60 both perform the reflection toward the direction of the optical storage layer 50. Thus, a light field in the resonant cavity is the strongest in the laser. The difference between the effective refractive index in the VCSEL light emission aperture and the effective refractive index outside the VCSEL light emission aperture is further reduced, thereby suppressing the generation of the high-order mode and reducing the divergence angle of the lasers.

For example, a uniform distribution may be understood as that the refractive index in this region is a fixed value. For example, the light reservoir layer 50 includes only one layer of material with a constant refractive index.

In an embodiment, referring to FIG. 7 or 9, the high refractive indexes and the low refractive indexes of the light reservoir layer 50 are alternately distributed along the direction perpendicular to the active layer 30. The light reservoir layer 50 may be understood as a middle Bragg reflection layer. The middle Bragg reflection layer includes multiple reflectors with the optical thickness of the quarter lasing wavelength, and the multiple reflectors are alternately disposed according to the high and low refractive indexes. The high refractive indexes and the low refractive indexes of the light reservoir layer 50 are set to be alternately distributed, the interface which enters the high-refractive-index layer from the low-refractive-index layer and is in the light reservoir layer 50 is placed at the peak intensity position of the standing wave light field, and the interface which enters s the low-refractive-index layer from the high-refractive-index layer and is in the light reservoir layer 50 is placed at the zero intensity position of the standing wave light field, which can cause the light reservoir layer 50 to increase the light field intensity in itself. The difference between the effective refractive index in the VCSEL light emission aperture and the effective refractive index outside the VCSEL light emission aperture is further reduced, thereby suppressing the generation of the high-order mode and reducing the divergence angle of the lasers.

In an embodiment, the refractive index contrast of the middle Bragg reflection layer in each half-wavelength period is lower than the corresponding refractive index contrast of the lower Bragg reflection layer 20 and/or the upper Bragg reflection layer 40 in each half-wavelength period.

For example, the refractive index contrast of the middle Bragg reflection layer in each half-wavelength period is lower than the corresponding refractive index contrast of the upper Bragg reflection layer 40 and/or the lower Bragg reflection layer 20 in each half-wavelength period, which may be understood as that the difference or ratio between the high refractive index and the low refractive index in the middle Bragg reflection layer in each half-wavelength period is less than the difference or ratio between the high refractive index and the low refractive index in the lower (upper) Bragg reflection layer in each half-wavelength period. The refractive index contrast of the middle Bragg reflection layer in each half-wavelength period is low, which can avoid the case where a few pairs of reflectors can make the light field in the light reservoir layer 50 very strong due to a very high contrast. That is, the refractive index contrast of the middle Bragg reflection layer in each half-wavelength period is relatively low, which can make the middle Bragg reflection layer include more pairs of reflectors. Thus, it can be ensured that the thickness of the middle Bragg reflection layer can meet the requirement that the single longitudinal mode lasing can be implemented and the divergence angle is greatly reduced at the same time.

In an embodiment, a light emission surface or a main light emission surface of the lasers is disposed on a side of the lower Bragg reflection layer 20 facing away from the active layer 30, and the reflectance of the upper Bragg reflection layer 40 is higher than the reflectance of the lower Bragg reflection layer 20.

Alternatively, a light emission surface or a main light emission surface of the lasers is disposed on a side of the upper Bragg reflection layer 40 facing away from the active layer 30, and the reflectance of the lower Bragg reflection layer 20 is higher than the reflectance of the upper Bragg reflection layer 40.

For example, if the light emission surface or the main light emission surface of the lasers is disposed on the side of the lower Bragg reflection layer 20 facing away from the active layer 30, the total reflectance of the reflectors included in the upper Bragg reflection layer 40 is higher than the total reflectance of the reflectors included in the lower Bragg reflection layer 20. Thus, the upper Bragg reflection layer 40 can implement total reflection and the lower Bragg reflection layer 20 can transmit out light. The light emission direction of the laser is the direction in which the active layer 30 points to the lower Bragg reflection layer 20, that is, the laser emits the light from its back. If the light emission surface or the main light emission surface of the lasers is disposed on the side of the upper Bragg reflection layer 40 facing away from the active layer 30, the total reflectance of the reflectors included in the lower Bragg reflection layer 20 is higher than the total reflectance of the reflectors included in the upper Bragg reflection layer 40. Thus, the lower Bragg reflection layer can implement the total reflection and the upper Bragg reflection layer 40 can transmit out the light. The light emission direction of the laser is the direction in which the active layer 30 points to the upper Bragg reflection layer 40, that is, the laser emits the light from its top. If each pair of reflectors (for example, each pair of reflectors include an upper reflector and a lower reflector) in the upper Bragg reflection layer 40 and the lower Bragg reflection layer 20 have the same refractive index contrast (for example, the refractive index contrast may refer to the absolute value of the difference between the refractive index of the upper reflector and the refractive index of the lower reflector), the number of pairs of reflectors included in the upper Bragg reflection layer 40 is set to be greater than the number of pairs of reflectors included in the lower Bragg reflection layer 20 when the light emission surface of the lasers is disposed on the side of the lower Bragg reflection layer 20 facing away from the active layer 30; and the number of pairs of reflectors included in the lower Bragg reflection layer 20 is set to be greater than the number of pairs of reflectors included in the upper Bragg reflection layer 40 when the light emission surface of the lasers is disposed on the side of the upper Bragg reflection layer 40 facing away from the active layer 30. In an embodiment, a microlens may be further disposed. The microlens is integrated on a side of the light emission surface and configured to further reduce the divergence angle of a far field.

In an embodiment, FIG. 15 is a structural diagram of another VCSEL with a small divergence angle according to an embodiment of the present application. Referring to FIG. 15, the active layer 30 includes at least two active sublayers (FIG. 15 exemplarily shows three active sublayers which are an active sublayer 31, an active sublayer 32, and an active sublayer 33, respectively), and two adjacent active sublayers are connected by a tunnel junction 80. The antireflection layer 60 and the light reservoir layer 50 are disposed on at least one side of each active sublayer; and at most one current confinement layer 70 exists in each active sublayer. The optical path distance between the tunnel junction 80 and the nearest node of the standing wave light field is less than one tenth of the lasing wavelength. For example, the tunnel junction 80 is disposed at the zero value position of the standing wave light field. Since the tunnel junction 80 is highly doped and these dopants will cause a light absorption loss and reduce light-emitting efficiency, the tunnel junction 80 is placed at a position with a weakest light field so that a light loss can be minimized.

Each active sublayer is provided with quantum wells (312/322/332). In the active sublayer, n-type semiconductor layers (313/323/333) and p-type semiconductor layers (311/321/331) are disposed on two sides of a quantum well, respectively. A first electrode layer 90 is disposed on a side of the substrate 10 facing away from the active layer 30, and a second electrode layer 100 is disposed on the side of the upper Bragg reflection layer 40 facing away from the active layer 30. A voltage difference is generated by external electric signals received by the first electrode layer 90 and the second electrode layer 100, thereby providing a current to the active layer. In the structure of the multiple sublayers, only one current confinement layer 70 may also be disposed. The current confinement layer 70 is disposed in the active sublayer (31) closest to the upper Bragg reflection layer 40. In an embodiment, the only one current confinement layer 70 is disposed, which may implement the definition of the light-emitting region and also reduce the effective refractive index of the current confinement layer 70 in a device. It is to be noted that multiple quantum wells may also be included in each active sublayer.

The embodiments of the present application further provide a VCSEL chip with the small divergence angle. The VCSEL chip with the small divergence angle includes multiple VCSELs with the small divergence angle according to any one of the preceding embodiments, where the multiple VCSELs with the small divergence angle are arranged in an array or arranged randomly. The VCSEL chip with the small divergence angle has the same technical effects, and the details are not repeated here.

The embodiments of the present application further provide a light source for a light detection and ranging (LIDAR) system, which includes at least one VCSEL with the small divergence angle according to any one of the preceding embodiments or at least one VCSEL chip with the small divergence angle according to any one of the preceding embodiments. The light source for the LIDAR system has the same technical effects, and the details are not repeated here.

In an embodiment, the multiple VCSELs with the small divergence angle may form an area array arrangement.

In an embodiment, the area array arrangement may be multiple subarrays for addressing. The addressing refers to that one or more of the subarrays may be individually lit.

For example, the VCSEL may have 600 light-emitting points, forming a 20×30 array of light-emitting points. The VCSEL may further divide the 20×30 array of light-emitting points into different subarrays, for example, 2×3 subarrays each of which has 10×10 light-emitting points. Each subarray may be individually controlled.

It is to be noted that the preceding are only some embodiments of the present application and the technical principles used therein. It is to be understood by those skilled in the art that the present application is not limited to the embodiments described herein. For those skilled in the art, various apparent modifications, adaptations and substitutions may be made without departing from the scope of the present application. Therefore, while the present application is described in detail through the preceding embodiments, the present application is not limited to the preceding embodiments and may include more equivalent embodiments without departing from the concept of the present disclosure. The scope of the present application is determined by the scope of the appended claims.

What is claimed is:

1. A vertical-cavity surface-emitting laser (VCSEL) with a small divergence angle, comprising:

a lower Bragg reflection layer;

an active layer disposed on a side of the lower Bragg reflection layer; and an upper Bragg reflection layer disposed on a side of the active layer facing away from the lower Bragg reflection layer;

wherein a current confinement layer defining a light-emitting region is disposed in the active layer or outside the active layer; a light reservoir layer is disposed at at least one of a position between the lower Bragg reflection layer and the active layer or a position between the upper Bragg reflection layer and the active layer, wherein the light reservoir layer is configured to store light field energy; and an antireflection layer having an antireflection interface is disposed between the light reservoir layer and the active layer, wherein the antireflection layer is configured to increase a maximal light field intensity of the light reservoir layer to be higher than a maximal light field intensity of the active layer;

wherein a number of current confinement layers is at least one, an optical path distance between a center of the current confinement layer along a direction perpendicular to the active layer and a nearest node of a standing wave light field is less than one tenth of a lasing wavelength; and wherein an optical thickness of the active layer is an odd multiple of a quarter lasing wavelength;

wherein along the direction perpendicular to the active layer, high refractive indexes and low refractive indexes of the light reservoir layer are alternately distributed, an interface which enters a high-refractive-index layer from a low-refractive-index layer and is in the light reservoir layer is disposed at a peak intensity position of the standing wave light field, and an interface which enters the low-refractive-index layer from the high-refractive-index layer and is in the light reservoir layer is disposed at a zero intensity position of the standing wave light field.

2. The VCSEL with a small divergence angle according to claim 1, wherein a number of current confinement layers is at least one, a center of the current confinement layer along the direction perpendicular to the active layer is aligned with a node of the standing wave light field.

3. The VCSEL with a small divergence angle according to claim 1, wherein the current confinement layer comprises an oxide layer which is an epitaxially grown AlGaAs with a high Al content, and an outer oxidized region of the oxide layer forms an insulating aluminum oxide film, wherein an unoxidized region of the oxide layer forms a light-emitting region in which an effective current is injected.

4. The VCSEL with a small divergence angle according to claim 1, wherein, along a direction in which the active layer points to the light reservoir layer, the antireflection interface comprises at least one of a first antireflection interface or a second antireflection interface, the first antireflection interface is between the light reservoir layer and the active layer and disposed at an interface position from the low refractive index to the high refractive index, the second antireflection interface is between the light reservoir layer and the active layer and disposed at an interface position from the high refractive index to the low refractive index; and wherein at least one of the following conditions is satisfied:

an optical path distance between the first antireflection interface and a nearest antinode of a standing wave light field is less than one tenth of a lasing wavelength; or an optical path distance between the second antireflection interface and a nearest node of the standing wave light field is less than one tenth of the lasing wavelength.

5. The VCSEL with a small divergence angle according to claim 4, wherein the first antireflection interface is at an antinode of the standing wave light field; and the second antireflection interface is at a node of the standing wave light field.

6. The VCSEL with a small divergence angle according to claim 4, wherein, along the direction in which the active layer points to the light reservoir layer, an optical distance between the first antireflection interface of the antireflection layer and any interface which is from the low refractive index to the high refractive index and in one of the upper Bragg reflection layer and the lower Bragg reflection layer which is located on an opposite side to the light reservoir layer with respect to the active layer is an integer multiple of a half wavelength; and an optical distance between the first antireflection interface of the antireflection layer and any interface which is from the low refractive index to the high refractive index and in an other one of the upper Bragg reflection layer and the lower Bragg reflection layer which is located on a same side of the light reservoir layer with respect to the active layer is an odd multiple of a quarter lasing wavelength; and an optical distance between the second antireflection interface of the antireflection layer and any interface which is from the high refractive index to the low refractive index and in the one of the upper Bragg reflection layer and the lower Bragg reflection layer which is located on the opposite side to the light reservoir layer with respect to the active layer is the integer multiple of the half wavelength; and an optical distance between the second antireflection interface of the antireflection layer and any interface which is from the high refractive index to the low refractive index and in other one of the upper Bragg reflection layer and the lower Bragg reflection layer which is located on the same side of the light reservoir layer with respect to the active layer is the odd multiple of the quarter lasing wavelength.

7. The VCSEL with a small divergence angle according to claim 4, wherein, the antireflection layer comprises one of the first antireflection interface and the second antireflection interface; and the one of the first antireflection interface and the second antireflection interface is disposed at a contact interface between the light reservoir layer and the active layer, or the one of the first antireflection interface and the second antireflection interface is an interface where a refractive index midpoint of a graded-refractive-index layer between the light reservoir layer and the active layer is located.

8. The VCSEL with a small divergence angle according to claim 4, wherein, the antireflection layer comprises two antireflection interfaces; and one of the two antireflection interfaces is a contact interface between the light reservoir layer and the antireflection layer, or one of the antireflection interfaces is an interface where a refractive index midpoint of a graded-refractive-index layer between the light reservoir layer and the antireflection layer is located; and the other one of the two antireflection interfaces is a contact interface between the active layer and the antireflection layer, or the other one of the two antireflection interfaces is an interface where a refractive index midpoint of a graded-refractive-index layer between the active layer and the antireflection layer is located.

9. The VCSEL with a small divergence angle according to claim 8, wherein, the two antireflection interfaces are the first antireflection interface and the second antireflection interface, respectively; and along a direction perpendicular to the active layer, an optical thickness between the two antireflection interfaces is an odd multiple of a quarter lasing wavelength;

or, the two antireflection interfaces are both first antireflection interfaces; and along a direction perpendicular to the active layer, an optical thickness between the two antireflection interfaces is an integer multiple of a half lasing wavelength; and or, the two antireflection interfaces are both second antireflection interfaces; and along a direction perpendicular to the active layer, an optical thickness between the two antireflection interfaces is an integer multiple of a half lasing wavelength.

10. The VCSEL with a small divergence angle according to claim 4, wherein, a number of antireflection interfaces comprised in the antireflection layer is greater than or equal to three; the antireflection layer comprises m first antireflection interfaces and n second antireflection interfaces, wherein m is an integer greater than or equal to one, and n is an integer greater than or equal to one; and one of a first one of the antireflection interfaces and an (m+n)-th one of the antireflection interfaces is the first antireflection interface, the other one of the first one of the antireflection interfaces and the (m+n)-th one of the antireflection interfaces is the second antireflection interface, and an optical thickness of the antireflection layer is an odd multiple of a quarter lasing wavelength; and along the direction in which the active layer points to the light reservoir layer, the first one of the antireflection interfaces is a contact interface between the active layer and the antireflection layer, or the first one of the antireflection interfaces is an interface where a refractive index midpoint of a graded-refractive-index layer between the active layer and the antireflection layer is located; a second one to an (m+n−1)-th one of the antireflection interfaces are a contact interface between two adjacent high- and low-refractive-index sublayers in the antireflection layer, or a second one to an (m+n−1)-th one of the antireflection interfaces are an interface where a refractive index midpoint of a graded-refractive-index layer between high- and low-refractive-index sublayers is located; and the (m+n)-th one of the antireflection interfaces is a contact interface between the light reservoir layer and the antireflection layer, or the (m+n)-th one of the antireflection interfaces is an interface where a refractive index midpoint of a graded-refractive-index layer between the light reservoir layer and the antireflection layer is located.

11. The VCSEL with a small divergence angle according to claim 10, wherein, a distance between any two first antireflection interfaces or a distance between any two second antireflection interfaces is the integer multiple of the half lasing wavelength; and a distance between any first antireflection interface and any second antireflection interface is the odd multiple of the quarter lasing wavelength.

12. The VCSEL with a small divergence angle according to claim 11, wherein the first antireflection interfaces and the second antireflection interfaces are alternately disposed, and an optical thickness between two adjacent antireflection interfaces is the quarter lasing wavelength.

13. The VCSEL with a small divergence angle according to claim 4, wherein, a number of antireflection interfaces comprised in the antireflection layer is greater than or equal to three; the antireflection layer comprises m first antireflection interfaces and n second antireflection interfaces, wherein m is an integer greater than or equal to zero, and n is an integer greater than or equal to zero; and both a first one of the antireflection interfaces and an (m+n)-th one of the antireflection interfaces are first antireflection interfaces or second antireflection interfaces, and an optical thickness of the antireflection layer is an integer multiple of a half lasing wavelength; and along the direction in which the active layer points to the light reservoir layer, the first one of the antireflection interfaces is a contact interface between the active layer and the antireflection layer, or the first one of the antireflection interfaces is an interface where a refractive index midpoint of a graded-refractive-index layer between the active layer and the antireflection layer is located; a second one to an (m+n−1)-th one of the antireflection interfaces are a contact interface between two adjacent high- and low-refractive-index sublayers in the antireflection layer, or a second one to an (m+n−1)-th one of the antireflection interfaces are an interface where a refractive index midpoint of a graded-refractive-index layer between high- and low-refractive-index sublayers is located; and the (m+n)-th one of the antireflection interfaces is a contact interface between the light reservoir layer and the antireflection layer, or the (m+n)-th one of the antireflection interfaces is an interface where a refractive index midpoint of a graded-refractive-index layer between the light reservoir layer and the antireflection layer is located.

14. The VCSEL with a small divergence angle according to claim 1, wherein a material of at least one of the upper Bragg reflection layer, the lower Bragg reflection layer, the antireflection layer, or the light reservoir layer is a dielectric material.

15. The VCSEL with a small divergence angle according to claim 1, wherein a material of at least one of the upper Bragg reflection layer, the lower Bragg reflection layer, the antireflection layer, or the light reservoir layer is a semiconductor material.

16. The VCSEL with a small divergence angle according to claim 1, wherein the active layer comprises at least one quantum well, an optical path distance between a center of each of the at least one quantum well along a direction perpendicular to the active layer and a nearest antinode of a standing wave light field is less than one fifth of a lasing wavelength.

17. The VCSEL with a small divergence angle according to claim 16, wherein the active layer comprises at least two active sublayers, and each of the active sublayers comprises the at least one quantum well; two adjacent active sublayers are connected by a tunnel junction; and an optical path distance between the tunnel junction and a nearest node of the standing wave light field is less than one tenth of the lasing wavelength.

18. The VCSEL with a small divergence angle according to claim 17, wherein the antireflection layer and the light reservoir layer are disposed on at least one side of each of the at least two active sublayers; at most one current confinement layer exists in each of the at least two active sublayers; and the tunnel junction is disposed at a zero value position of a standing wave light field.

19. The VCSEL with a small divergence angle according to claim 1, wherein, the light reservoir layer comprises a middle Bragg reflection layer, wherein the middle Bragg reflection layer comprises a plurality of reflectors with an optical thickness of a quarter lasing wavelength, and the plurality of reflectors are alternately disposed according to high and low refractive indexes.

20. The VCSEL with a small divergence angle according to claim 19, wherein a refractive index contrast of the middle Bragg reflection layer in each half-wavelength period is lower than a corresponding refractive index contrast of the lower Bragg reflection layer and/or the upper Bragg reflection layer in each half-wavelength period.

21. The VCSEL with a small divergence angle according to claim 1, further comprising a substrate, wherein the substrate is disposed on a side of the lower Bragg reflection layer facing away from the active layer, and a material of the substrate comprises GaAs or Si.

22. The VCSEL with a small divergence angle according to claim 1, further comprising a transparent superstrate, wherein the superstrate is disposed on a side of the upper Bragg reflection layer facing away from the active layer, and a material of the transparent superstrate comprises sapphire, quartz, glass, or a transparent polymer.

23. The VCSEL with a small divergence angle according to claim 1, wherein, a light emission surface or a main light emission surface of a laser is disposed on a side of the lower Bragg reflection layer facing away from the active layer, and reflectance of the upper Bragg reflection layer is higher than reflectance of the lower Bragg reflection layer;

or, a light emission surface or a main light emission surface of a laser is disposed on a side of the upper Bragg reflection layer facing away from the active layer, and reflectance of the lower Bragg reflection layer is higher than reflectance of the upper Bragg reflection layer.

24. The VCSEL with a small divergence angle according to claim 23, further comprising a microlens integrated on a side of the light emission surface and configured to reduce a divergence angle of a far field.

25. A VCSEL chip with a small divergence angle, comprising a plurality of VCSELs with the small divergence angle according to claim 1, wherein the plurality of VCSELs with the small divergence angle form an area array arrangement which is a regular arrangement, a random arrangement, or a plurality of subarrays for addressing.

26. A light source for a light detection and ranging (LIDAR) system, comprising at least one VCSEL with the small divergence angle according to claim 1.

27. The VCSEL with a small divergence angle according to claim 1, wherein the current confinement layer is outside the active layer, and the current confinement layer is disposed within two wavelengths from a side of the active layer along the direction perpendicular to the active layer.

28. The VCSEL with a small divergence angle according to claim 1, wherein the small divergence angle denotes a divergence angle less than 20 degrees.

29. The VCSEL with a small divergence angle according to claim 1, wherein the active layer comprises more than one quantum well, and an optical path distance between a center position of an entire group of quantum wells and the nearest antinode of the standing wave light field is less than one tenth of the lasing wavelength.

* * * * *